(12) United States Patent
Hsu et al.

(10) Patent No.: US 12,196,780 B2
(45) Date of Patent: Jan. 14, 2025

(54) PROBE ASSEMBLY WITH MULTIPLE SPACERS AND METHODS OF ASSEMBLING THE SAME

(71) Applicant: Taiwan Semiconductor Manufacturing Company Limited, Hsinchu (TW)

(72) Inventors: Ming-Cheng Hsu, Hsinchu (TW); Wen-Chun Tu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 439 days.

(21) Appl. No.: 17/572,371

(22) Filed: Jan. 10, 2022

(65) Prior Publication Data

US 2023/0045361 A1    Feb. 9, 2023

Related U.S. Application Data

(60) Provisional application No. 63/229,828, filed on Aug. 5, 2021.

(51) Int. Cl.
*G01R 1/073* (2006.01)
*G01R 1/14* (2006.01)
*G01R 3/00* (2006.01)

(52) U.S. Cl.
CPC ................................ *G01R 1/07314* (2013.01)

(58) Field of Classification Search
CPC ........ G01R 3/00; G01R 1/07314; H01L 22/00
See application file for complete search history.

(56) References Cited

U.S. PATENT DOCUMENTS

| | | | | |
|---|---|---|---|---|
| 2002/0155735 A1* | 10/2002 | Zhou | ................... | H01R 13/2464 439/66 |
| 2007/0001692 A1* | 1/2007 | Yamada | ............. | G01R 1/07371 324/754.08 |
| 2007/0216430 A1* | 9/2007 | Watanabe | .......... | G01R 31/2891 324/762.01 |
| 2008/0139017 A1* | 6/2008 | Kiyofuji | ............ | G01R 1/07371 439/75 |
| 2008/0297184 A1* | 12/2008 | Miura | ................ | G01R 1/07364 324/762.05 |
| 2017/0122984 A1* | 5/2017 | Hsu | ..................... | G01R 1/07314 |

* cited by examiner

Primary Examiner — Jermele M Hollington
Assistant Examiner — Temilade S Rhodes-Vivour
(74) Attorney, Agent, or Firm — The Marbury Law Group, PLLC

(57) ABSTRACT

A probe assembly includes a multilayer structure including probe contact pads, an upper guide plate including an array of upper holes therethrough, a lower guide plate including an array of lower holes therethrough, a vertical stack of a plurality of dielectric spacer plates located between the upper guide plate and the lower guide plate and including a respective opening therethrough, and an array of probes attached to the probe contact pads, vertically extending through the array of upper holes and the array of lower holes, and vertically extending through the openings through the vertical stack of the plurality of dielectric spacer plates.

20 Claims, 19 Drawing Sheets

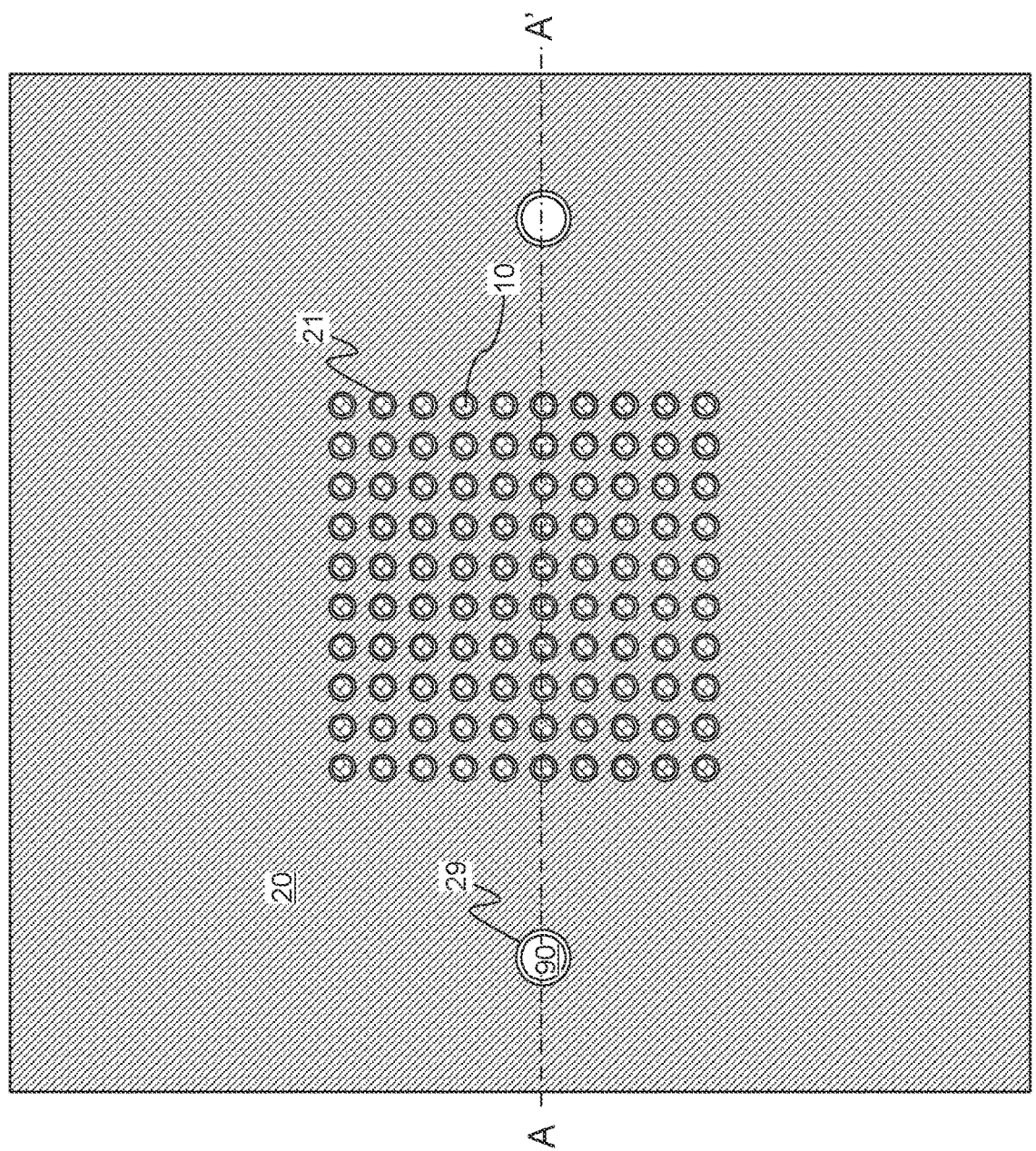

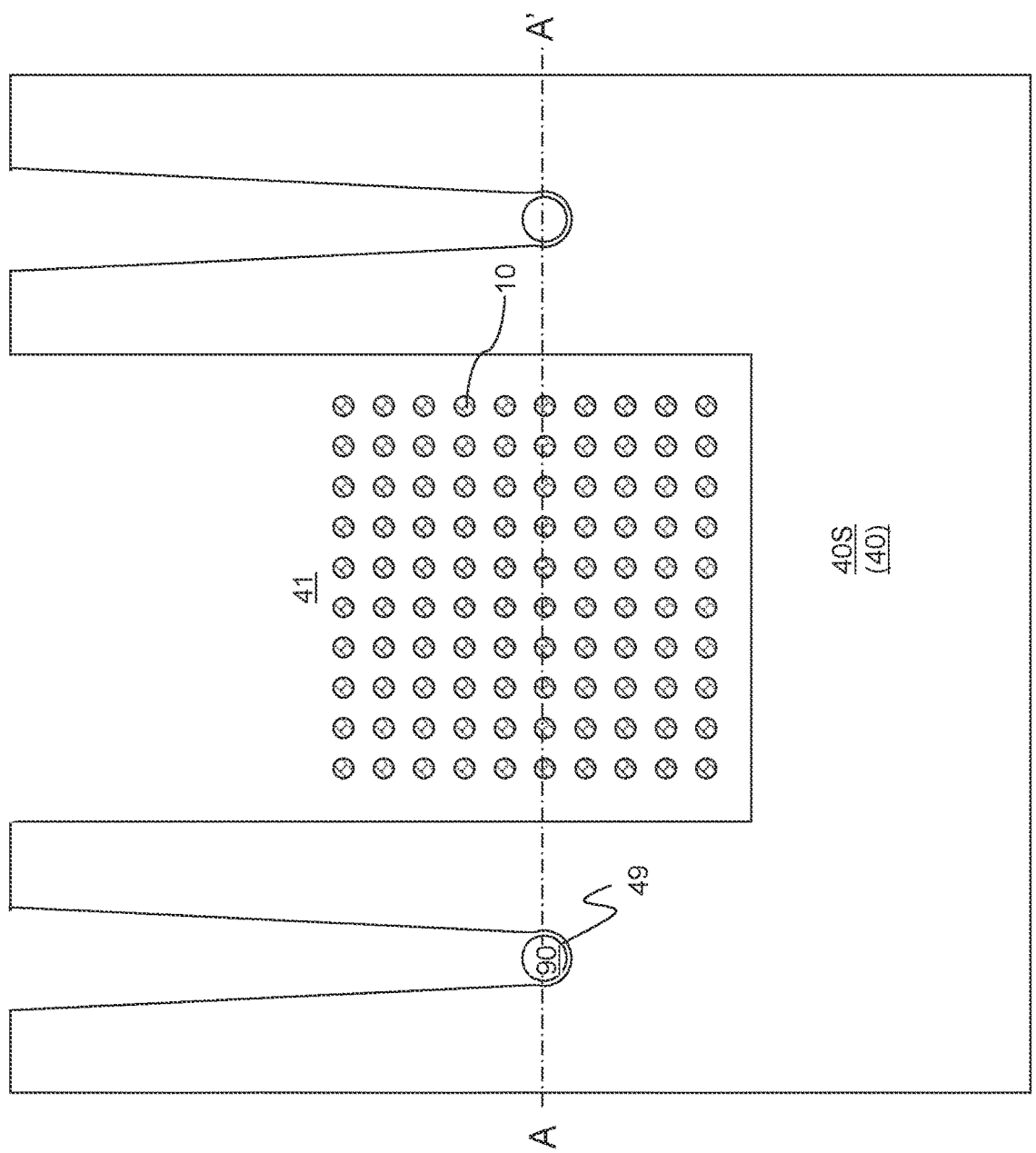

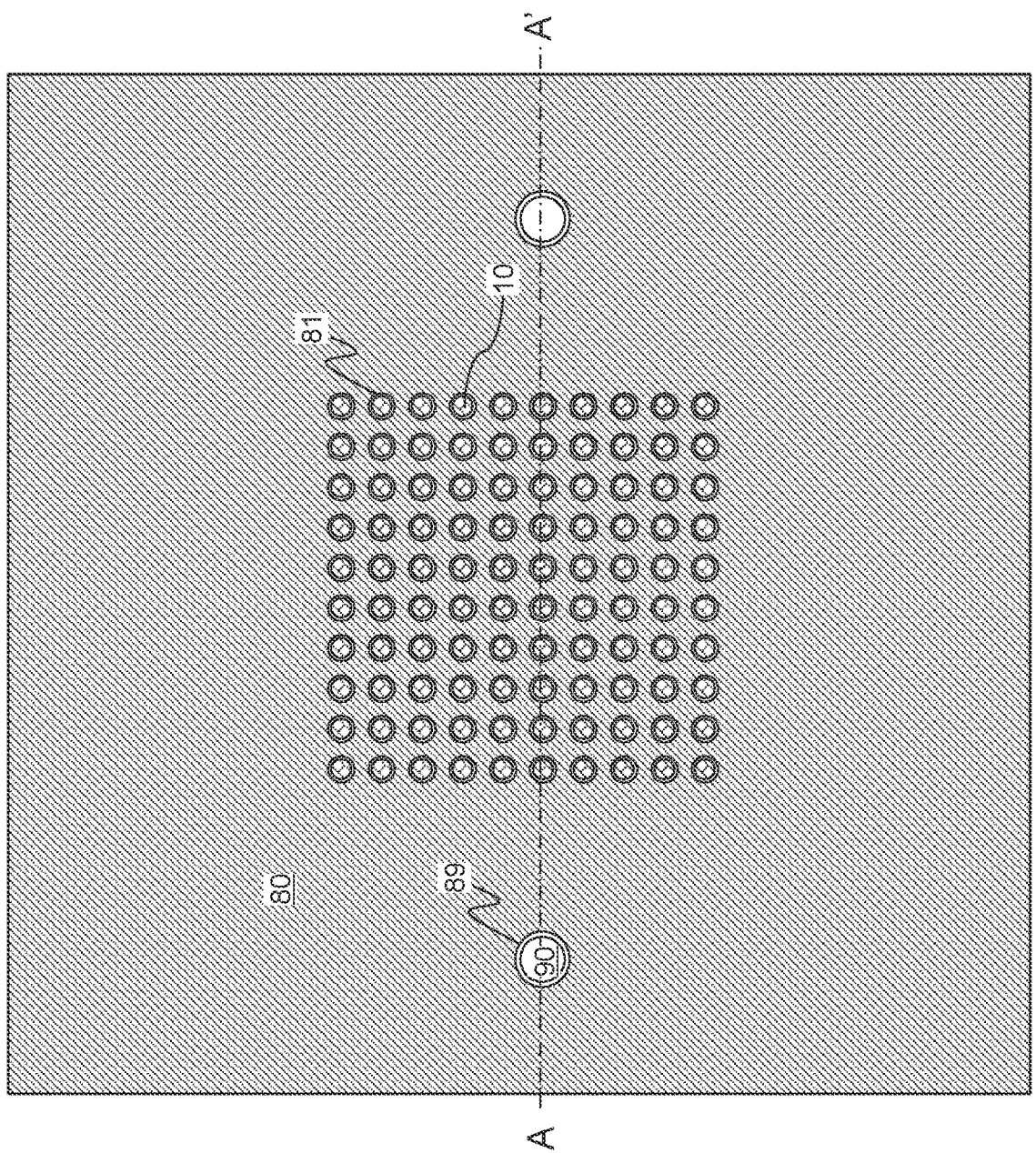

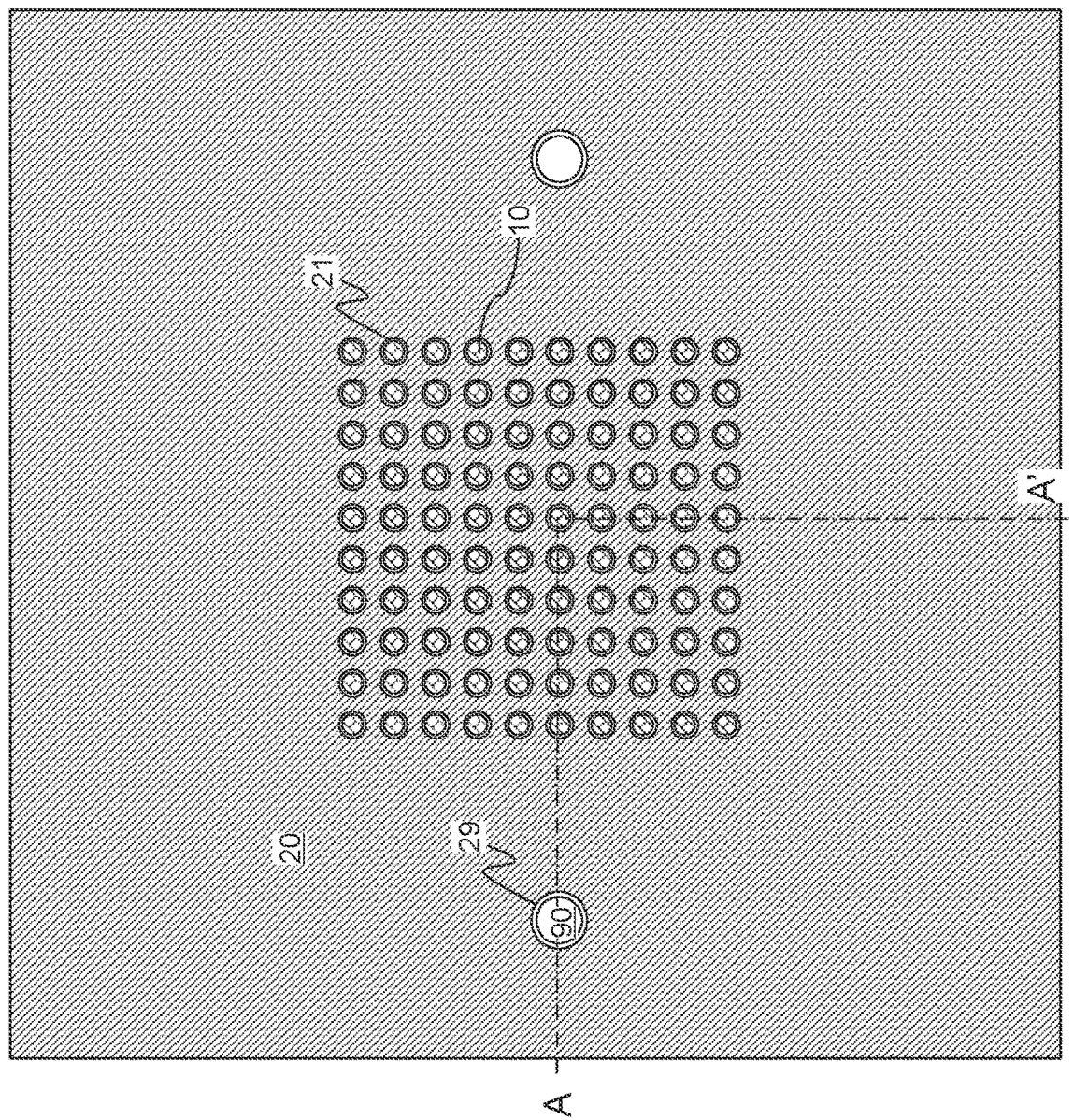

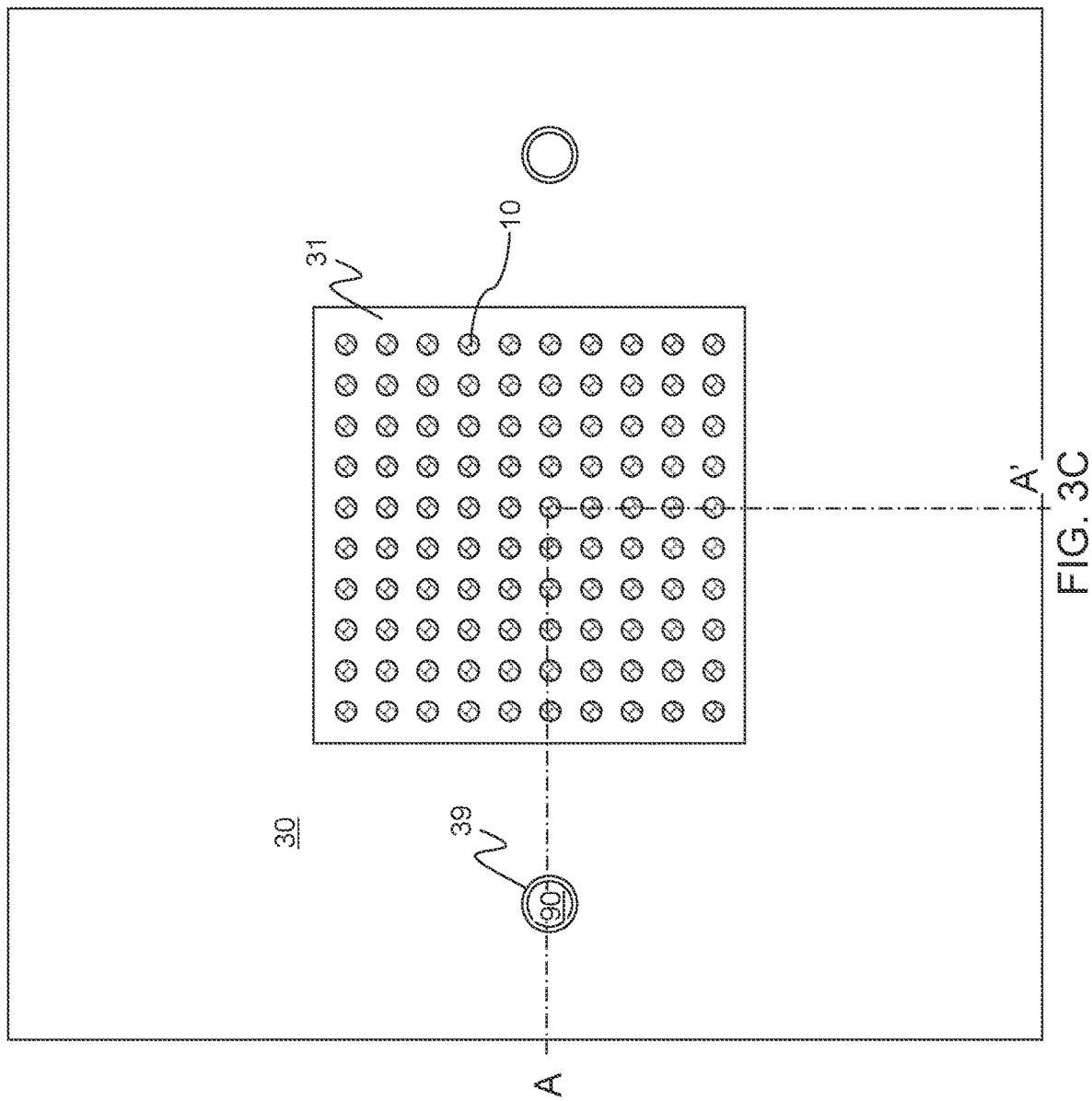

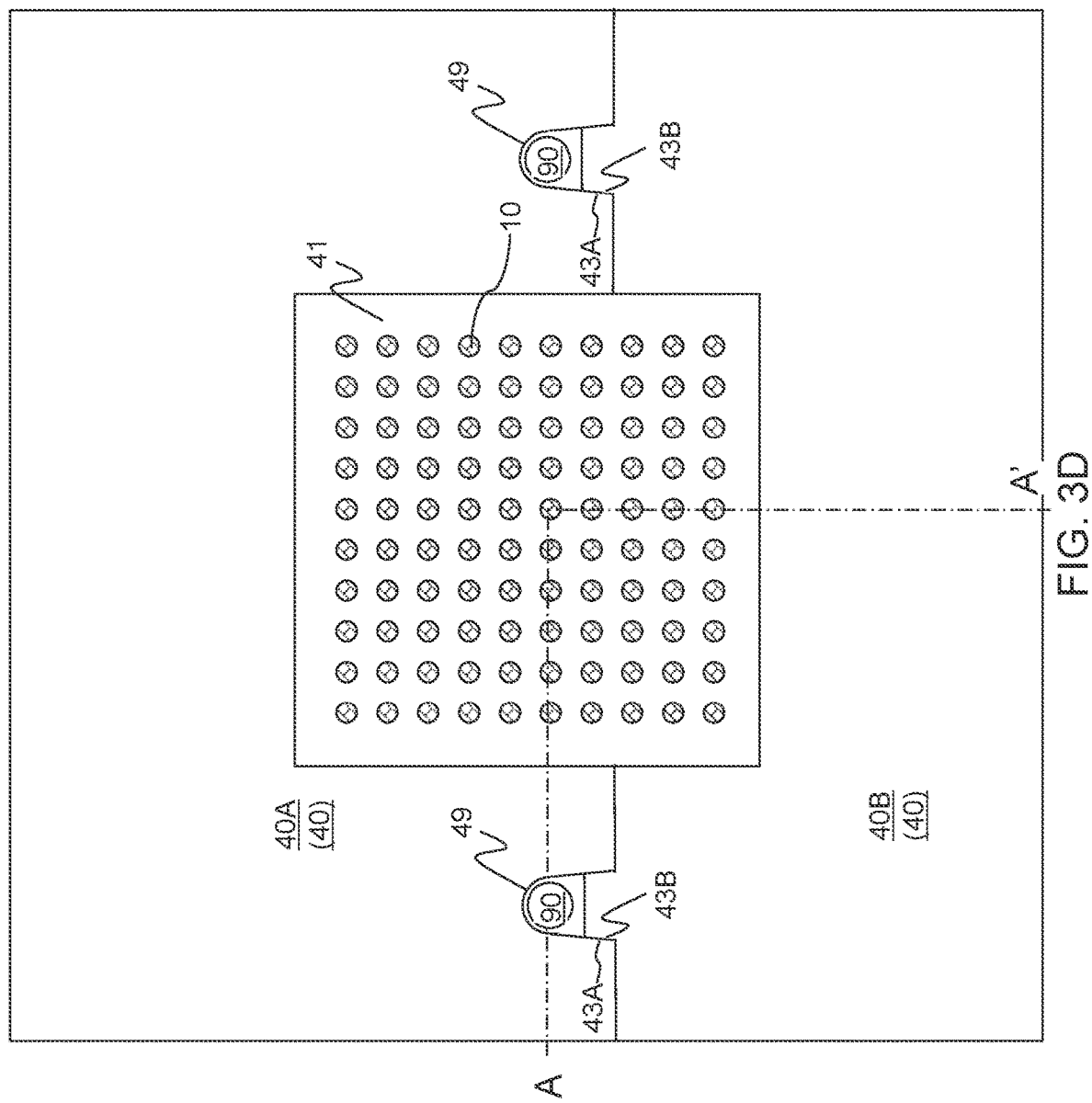

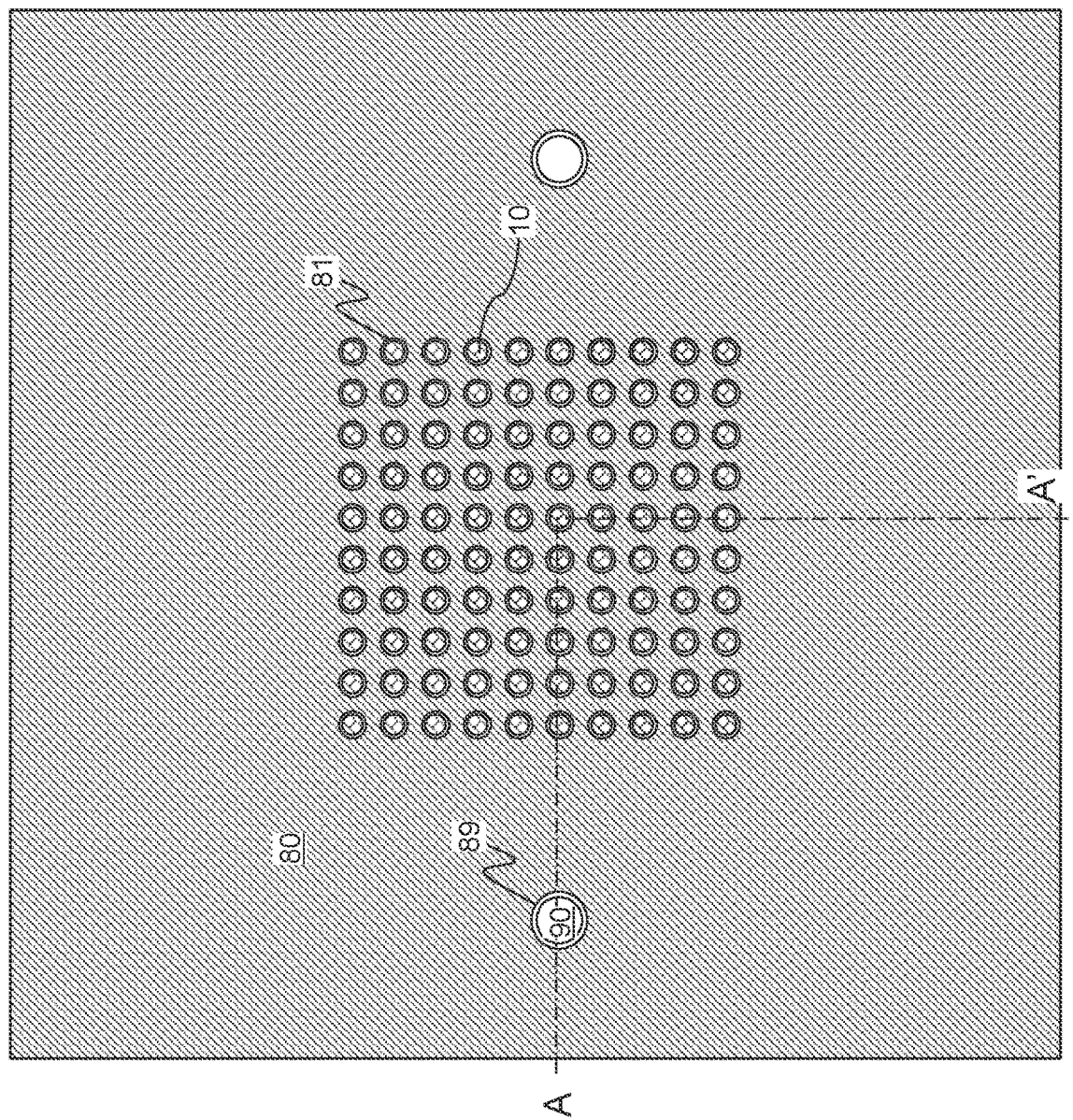

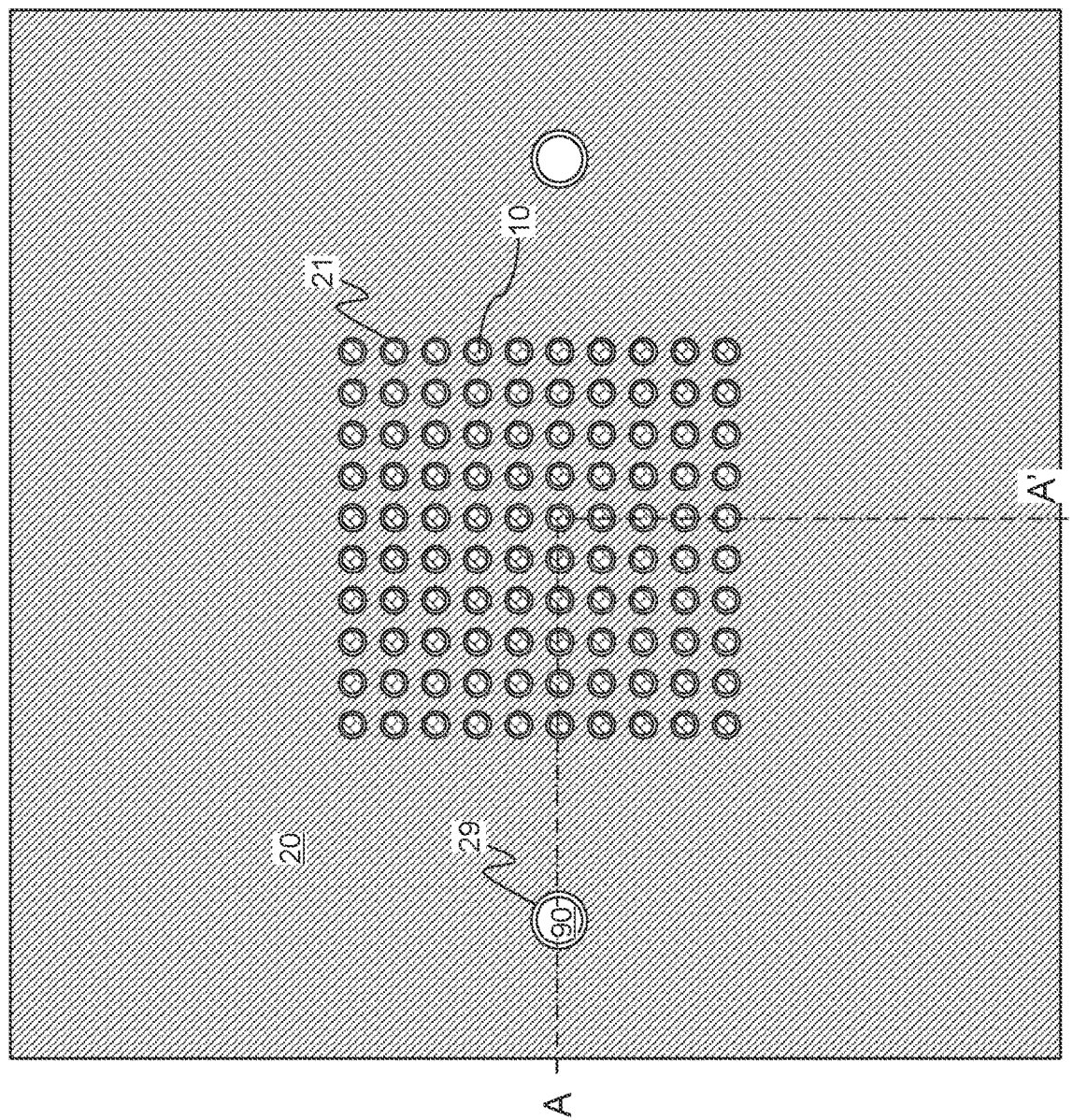

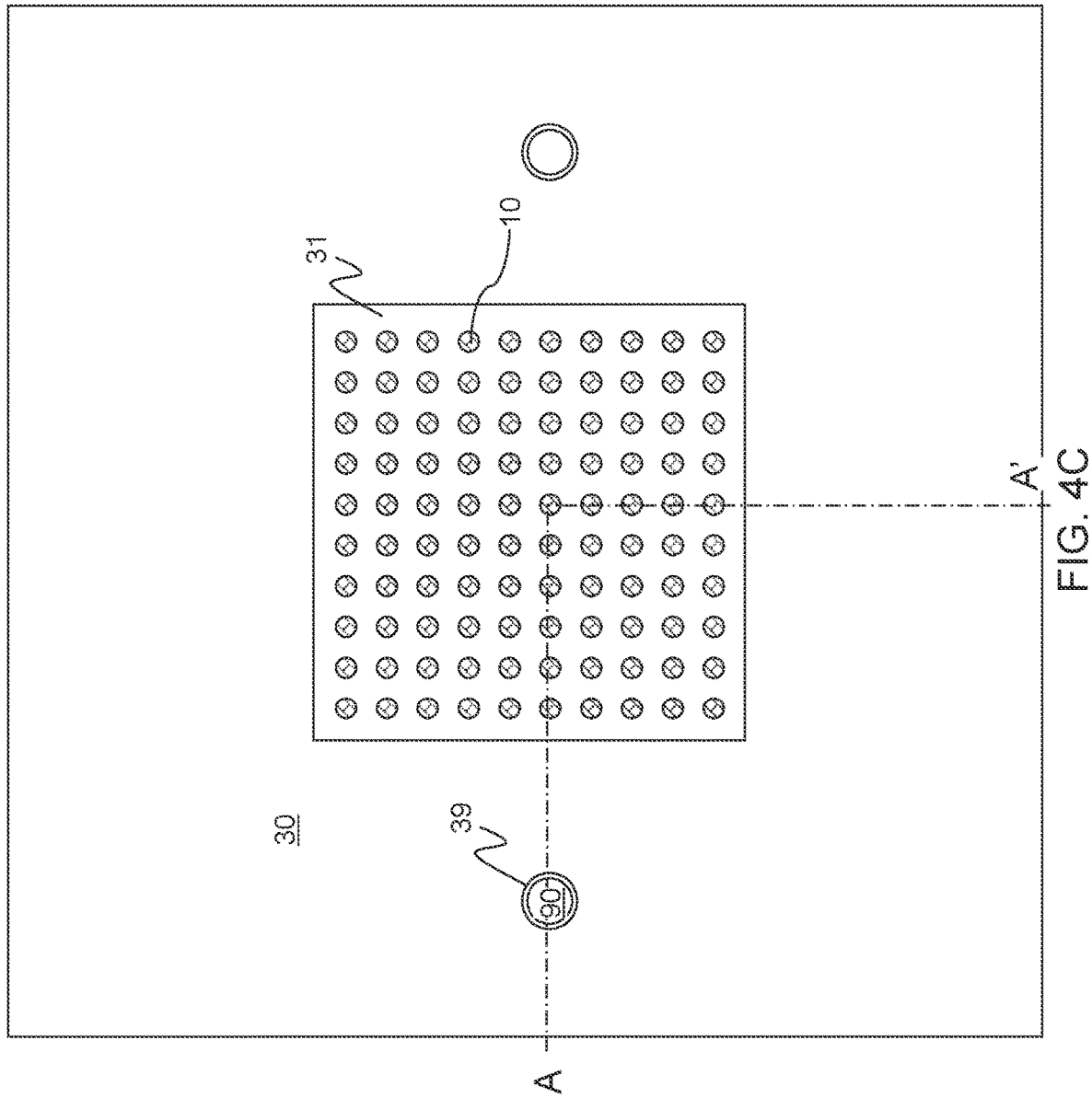

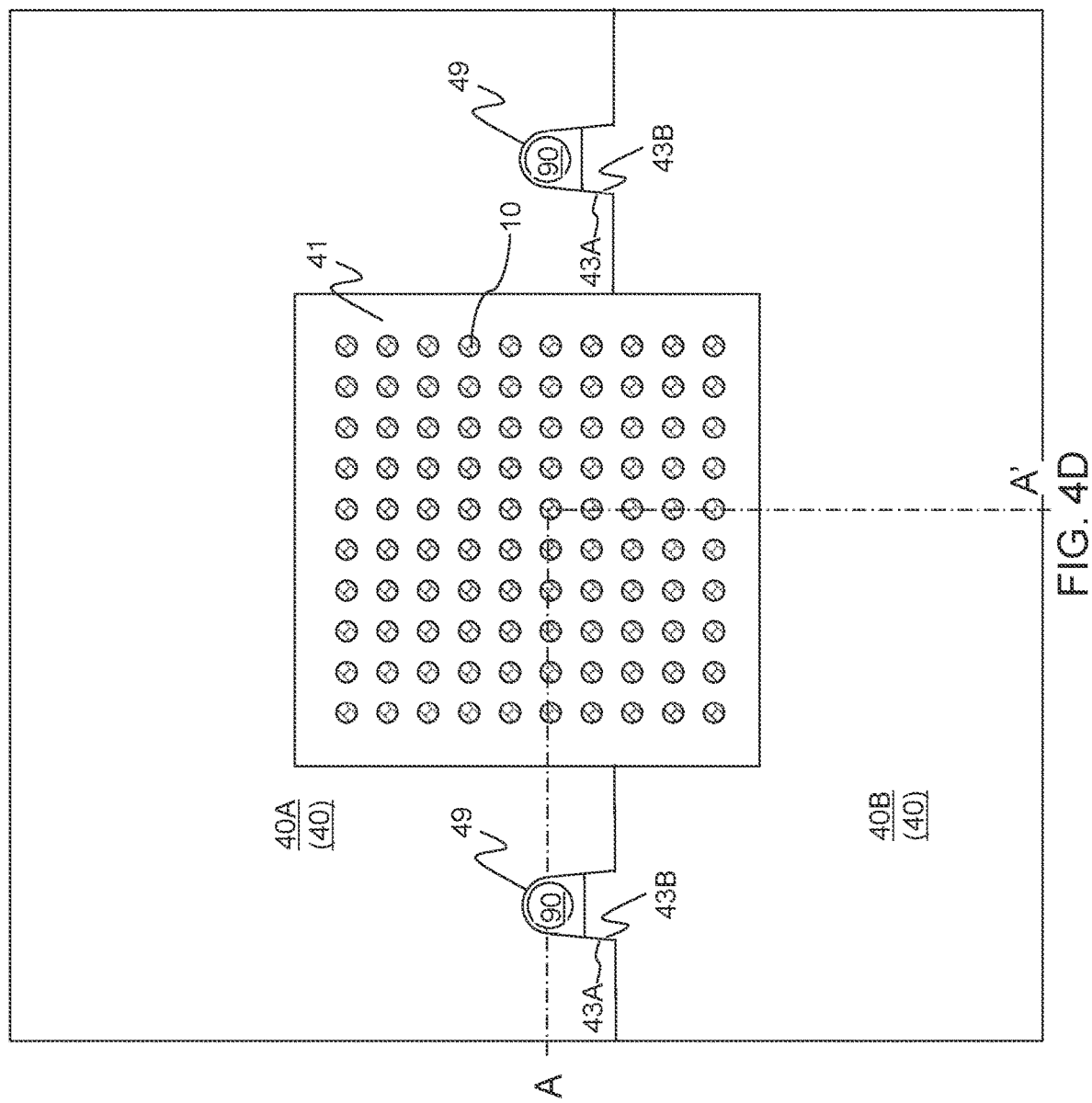

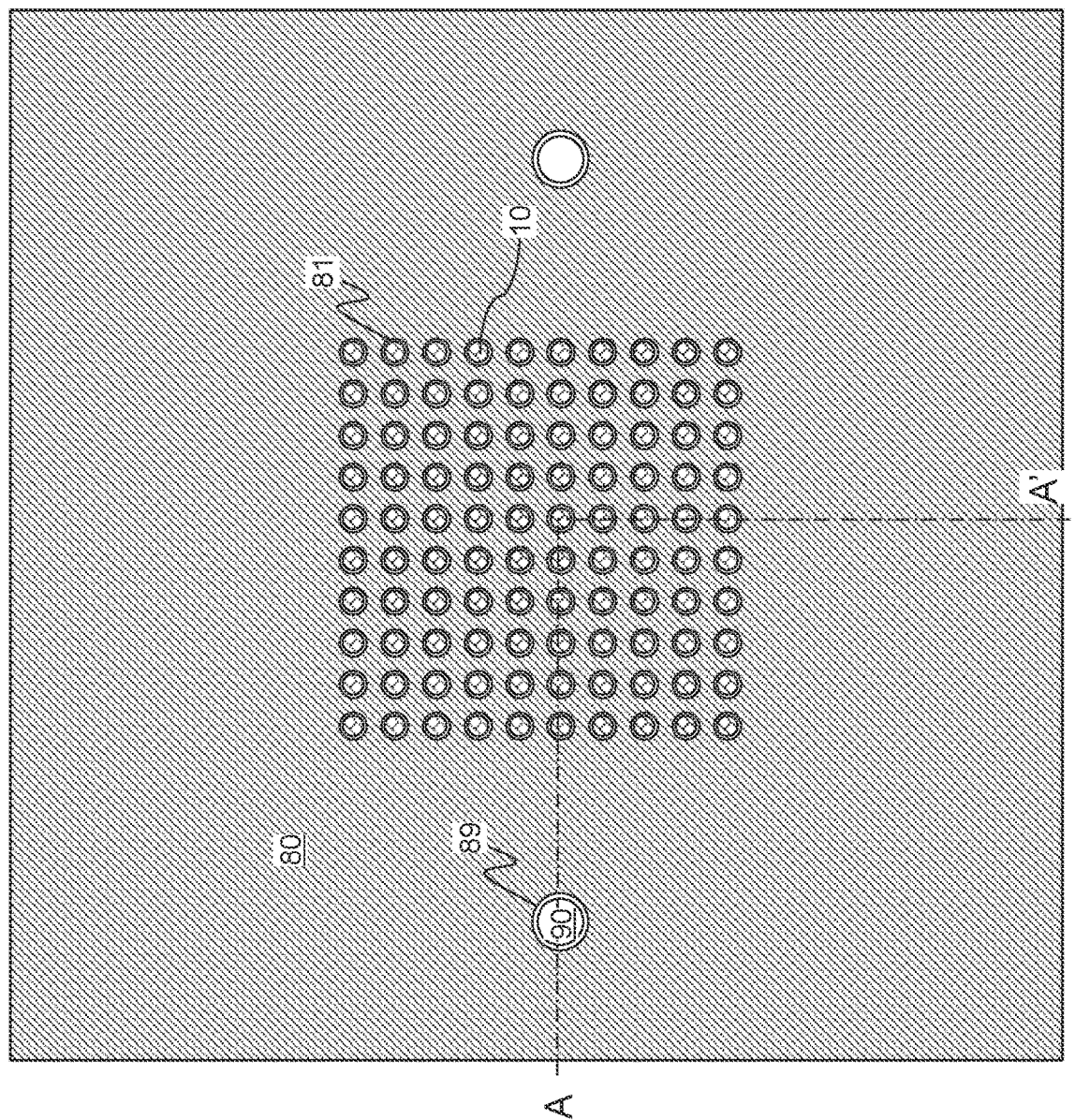

PROBE ASSEMBLY WITH MULTIPLE SPACERS AND METHODS OF ASSEMBLING THE SAME

RELATED APPLICATIONS

This application claims the benefit of priority from U.S. Provisional Application No. 63/229,828 titled "Two Layer Spacers of Probe Head Assembly for Auto Pin Insertion" and filed on Aug. 5, 2021, the entire contents of which are incorporated herein by reference for all purposes.

BACKGROUND

A probe card may be built and used in a test apparatus to enable testing of semiconductor dies once the electrical layout of an array of test pads in the semiconductor dies is known. High density metal pads in semiconductor dies utilize a probe card with a fine pitch and a high pin count. Parallel testing may be used to cope with the complexity of semiconductor-on-chip (SoC) devices and to probe more than one device at a time, thereby enhance the test output of the test apparatus. Tester throughput is oftentimes a limiting factor in semiconductor fabrication capacity, and improvements in probe cards are desirable to increase the throughput in testing with probe cards.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a horizontal cross-sectional view along the horizontal plane B-B' of the first exemplary probe assembly of FIG. 2A.

FIG. 2D is a horizontal cross-sectional view along the horizontal plane D-D' of the first exemplary probe assembly of FIG. 2A.

FIG. 2E is a horizontal cross-sectional view along the horizontal plane E-E' of the first exemplary probe assembly of FIG. 2A.

FIG. 3B is a horizontal cross-sectional view along the horizontal plane B-B' of the second exemplary probe assembly of FIG. 3A.

FIG. 3C is a horizontal cross-sectional view along the horizontal plane C-C' of the second exemplary probe assembly of FIG. 3A.

FIG. 3D is a horizontal cross-sectional view along the horizontal plane D-D' of the second exemplary probe assembly of FIG. 3A.

FIG. 3E is a horizontal cross-sectional view along the horizontal plane E-E' of the second exemplary probe assembly of FIG. 3A.

FIG. 4B is a horizontal cross-sectional view along the horizontal plane B-B' of the third exemplary probe assembly of FIG. 4A.

FIG. 4C is a horizontal cross-sectional view along the horizontal plane C-C' of the third exemplary probe assembly of FIG. 4A.

FIG. 4D is a horizontal cross-sectional view along the horizontal plane D-D' of the third exemplary probe assembly of FIG. 4A.

FIG. 4E is a horizontal cross-sectional view along the horizontal plane E-E' of the third exemplary probe assembly of FIG. 4A.

DETAILED DESCRIPTION

Figure 1:
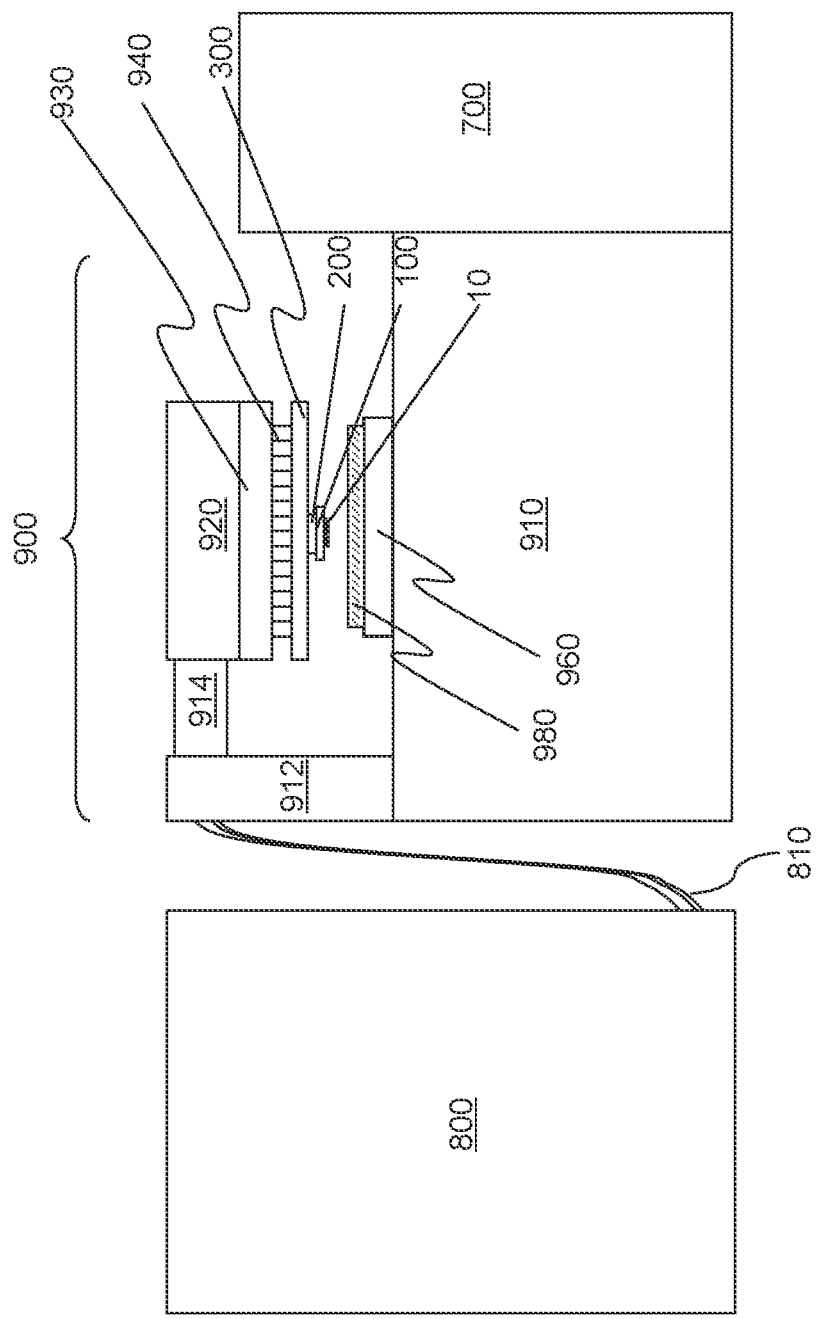
FIG. 1 is a schematic view of a test apparatus according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A test apparatus may include a tester head, a probe card attached to the tester head, and a probe assembly attached to the probe card. The probe assembly may include probes that may be attached to probe contact pads within a multilayer structure including redistribution structures. The probes may be spatially and structurally stabilized by providing guide plates. The guide plates may include an upper guide plate that is proximal to the multilayer structure, and a lower guide plate that is distal from the multilayer structure. A dielectric spacer plate may be used to provide vertical spacing between the upper guide plate and the lower guide plate. During assembly of the upper guide plate, the lower guide plate, and the dielectric spacer plate, the probes may be inserted through arrays of holes in the guide plates and through an opening in the dielectric spacer plate. An automated probe insertion process is typically used to automate the insertion of the probes through the guide plates and the dielectric spacer plate. The throughput of the automated probe insertion process is generally proportional to the thickness of the dielectric spacer plate. In other words, the thicker the dielectric spacer plate, the more time it takes for the automated probe insertion process to successfully insert an array of probes through an assembly of an upper guide plate, a lower guide plate, and a dielectric spacer plate.

A minimum vertical distance between the upper guide plate and the lower guide plate may be necessary to provide sufficient structural stability in the probe assembly. The minimum vertical distance is typically in a range from 3 mm to 6 mm, such as about 4 nm. According to an aspect of the present disclosure, a plurality of dielectric spacer plates may be used in lieu of the a single dielectric spacer plate. One of the dielectric spacer plate may be positioned between the upper guide plate and the lower guide plate during the automated probe insertion process. At least another of the dielectric spacer plate may be inserted from the side after the automated probe insertion process to provide sufficient vertical spacing between the upper guide plate and the lower guide plate. Since the thickness of the dielectric spacer plate through which the probes are inserted is less than the final vertical spacing between the upper guide plate and the lower guide plate, the automated probe insertion process takes less time due to reduction of the thickness of the dielectric spacer plate that is present at the time of the insertion of the probes therethrough. At the same time, the final vertical spacing between the upper guide plate and the lower guide plate may be maintained at the same level, and thus, performance and the structural stability of the probe assembly are not affected. The various aspects of embodiments of the present disclosure are described in detail herebelow with reference to accompanying drawings.

Referring to FIG. 1, an exemplary test apparatus embodying an aspect of the present disclosure is illustrated. The exemplary test apparatus may include a tester electronics unit 800 including at least one computer and peripheral devices, a wafer prober 900 in communication with the tester electronics unit 800, for example, via signal and power cables 810, and an optional wafer conveyer unit 700 configured to load and unload wafers 980 to be tested on the wafer prober 900. The wafer prober 900 may include a wafer chuck 960 configured to hold a wafer 980 thereupon, a prober frame 910 containing a stage drive unit configured to laterally drive the wafer chuck 960, a tester head 920 that overlies the wafer chuck 960, and tester head support structures (912, 914) configured to structurally support, and to provide movement to, the tester head 920.

A performance board 930 may be attached to the bottom of the tester head 920, and a probe card 300 may be attached to the bottom end of the performance board 930 using a suitable array of contact structures 940 such as an array of spring-type contact pins. The probe card 300 may comprise a printed circuit board (PCB) containing a plastic substrate and printed circuits thereupon. A stiffener (not illustrated) may be attached to the backside of the probe card 300 to reduce structural deformation of the probe card 300 due to thermal and/or mechanical stress during use of the probe card 300. The probe card 300 may also be referred to as a main board.

A probe assembly (10, 100, 200) may be attached to the bottom of the probe card 300. The probe assembly (10, 100, 200) comprises a multilayer structure 200, a plate assembly 100 including an upper guide plate, a lower guide plate, and a plurality dielectric spacer plates, and an array of probes 10. The probe assembly (10, 100, 200) may include various elements of the present disclosure. Specifically, the plate assembly 100 may be assembled in a manner that expedites the automated probe insertion process according to an embodiment of the present disclosure. Further, the plate assembly 100 may have structural characteristics that provide for an acceleration of the automated probe insertion process according to an embodiment of the present disclosure.

Referring to FIGS. 2A-2E, a region around a first exemplary probe assembly (10, 100, 200) is illustrated, which may be incorporated into the exemplary test apparatus of FIG. 1. The multilayer structure 200 may include an array of probe contact pads 220 having a same two-dimensional periodicity as an array of probes 10. The array of probes 10 may be attached to the array of probe contact pards 220 using methods known in the art. For example, the array of probes 10 may be attached to the array of probe contact pads 220 via solder material portions, metal-to-metal bonding, conductive paste portions, and/or epoxy.

The total number of probes 10 within the array of probes 10 is typically in a range from 500 to 100,000, although lesser and greater number of probes 10 may also be used. The pitch of the probes 10 (i.e., center-to-center distance between neighboring pairs of probes 10) may be the same as the pitch of the test access points (such as metallic test pads or solder material portions) on the unit under testing (UUT), such as a semiconductor die on a wafer 980 that is located on the wafer chuck 960. For example, the pitch of the probes 10 may be in a range from 10 microns to 100 microns, although lesser and greater pitches may also be used. While the present disclosure is described using an embodiment in which the probes 10 are arranged as a 10×10 rectangular array, embodiments are expressly contemplated herein in which the probes 10 are arranged in an array configuration of a different size or in a non-rectangular array.

The multilayer structure 200 may include a multilayer dielectric matrix 210 and redistribution structures 250 embedded in the multilayer dielectric matrix 210. The multilayer dielectric matrix 210 may include ceramic layers or organic layers. In embodiments in which the multilayer dielectric matrix 210 includes ceramic layers, the multilayer structure 200 may be referred to as multilayer ceramic structure. In embodiments in which the multilayer dielectric matrix 210 include organic layers, the multilayer structure 200 may be referred to as multilayer organic structure. A subset of the redistribution structure 250 may include an array of contact structures on a side that faces the probe card 300. The array of contact structures has a greater pitch than the pitch of the probes 10. The multilayer structure 200 may be attached to the probe card 300 through an array of interconnection structures 290, which may include an array of solder balls or may include an interposer structure including an array of vertical interconnection structures.

In one embodiment, the array of probes 10 may be attached to the array of probe contact pads 220 within a recess region 211 in which a horizontal surface of the multilayer structure 200 is recessed toward the probe card 300 (i.e., recessed upward) relative to a horizontal frame surface of the multilayer structure 200 that laterally surrounds the recess region.

According to an aspect of the present disclosure, the plate assembly 100 may include an upper guide plate 20 which may include an upper array of upper holes 21 therethrough, a lower guide plate 80 may include a lower array of lower holes 81 therethrough, and a vertical stack of a plurality of dielectric spacer plates (30, 40) located between the upper guide plate 20 and the lower guide plate 80 and comprising a respective opening (31, 41) therethrough. The upper guide plate 20 is more proximal to the multilayer structure 200 than the lower guide plate 80 is to the multilayer structure 200. In one embodiment, the upper guide plate 20 may contact a bottom surface (such as the horizontal frame surface of the multilayer structure 200. The lower guide plate 80 may be vertically spaced from the upper guide plate 20 by the vertical stack of the plurality of dielectric spacer plates (30, 40).

The array of probes 10 may be attached to the probe contact pads 220, and may vertically extend through the array of upper holes 21 and the array of lower holes 81, and may vertically extend through the openings (31, 41) through the vertical stack of the plurality of dielectric spacer plates (30, 40). The multilayer structure 200 may include the redistribution structures 250 and the multilayer dielectric matrix 210, which surrounds and embeds the redistribution structures 250. The probe contact pads 220 may be connected to a respective one of the redistribution structures 250.

In one embodiment, each dielectric spacer plate (30, 40) selected from the plurality of dielectric spacer plates (30, 40) comprises at least two guide openings (39, 49) therethrough, and the probe assembly (10, 100, 200) comprises at least two guide posts 90 vertically extending through a respective guide opening (39, 49) within each dielectric spacer plate (30, 40) selected from the plurality of dielectric spacer plates (30, 40). In one embodiment, the upper guide plate 20 comprises at least two upper guide openings 29 therethrough, and the lower guide plate 80 comprises at least two lower guide openings 89 therethrough. In one embodiment, each of the at least two guide posts 90 may vertically extend through a respective one of the upper guide openings 29 and through a respective one of the lower guide openings 89. In one embodiment, each of the at least two guide posts 90 may vertically extend through a respective one of the upper guide openings 29 and through a respective one of the lower guide openings 89 and through a respective guide opening (39, 49) within each dielectric spacer plate (30, 40) selected from the plurality of dielectric spacer plates (30, 40).

In one embodiment, each of the at least two guide posts 90 may include a respective fixture element at a top end, i.e., an end that is proximal to the multilayer structure 200. For example, a fixture element 92 such as a thread of a bolt may be used to enable mechanically fixing the top end of each of the at least two guide posts 90 onto, and/or into, the multilayer structure 200. In this embodiment, the multilayer structure 200 may include at least two mating fixture elements configured to mate with the fixture elements 92 of the at least two guide posts 90. For example, the multilayer structure 200 may include two or more threaded holes configured to accommodate, and form a stable mechanical support for, a thread of a bolt which may form a respective guide post 90. In an illustrative example, the at least two guide posts 90 may include at least two threaded bolts or at least two screws.

In one embodiment, the plurality of dielectric spacer plates (30, 40) may include at least one unitary dielectric spacer plate 30 that includes an outer periphery and an inner periphery that is laterally surrounded by, and is spaced from, the outer periphery. The unitary dielectric spacer plate 30 laterally surrounds each probe 10 selected from the array of probes 10. In one embodiment, the unitary dielectric spacer 30 may include an opening, of which the periphery is the inner periphery of the unitary dielectric spacer plate 30. In one embodiment, the inner periphery of the unitary dielectric spacer plate 30 may have a rectangular shape or a shape of a rounded rectangle. In one embodiment, the outer periphery of the unitary dielectric spacer plate 30 may have a rectangular shape of a shape of a rounded rectangle.

The thickness of the upper guide plate 20 may be in a range from 1 mm to 4 mm, such as from 1.5 mm to 2.5 mm, although lesser and greater thicknesses may also be used. The thickness of the lower guide plate 80 may be in a range from 1 mm to 4 mm, such as from 1.5 mm to 2.5 mm, although lesser and greater thicknesses may also be used. The total thickness of the vertical stack of the plurality of dielectric spacer plates (30, 40) may be in a range from 2 mm to 6 mm, such as from 3 mm to 5 mm, although lesser and greater total thicknesses may also be used. The thickness of the unitary dielectric spacer plate 30 may be in a range from 20% to 80%, such as from 30% to 60%, of the total thickness of the vertical stack of the plurality of dielectric spacer plates (30, 40), although lesser and greater thicknesses may also be used.

Figure 2A:
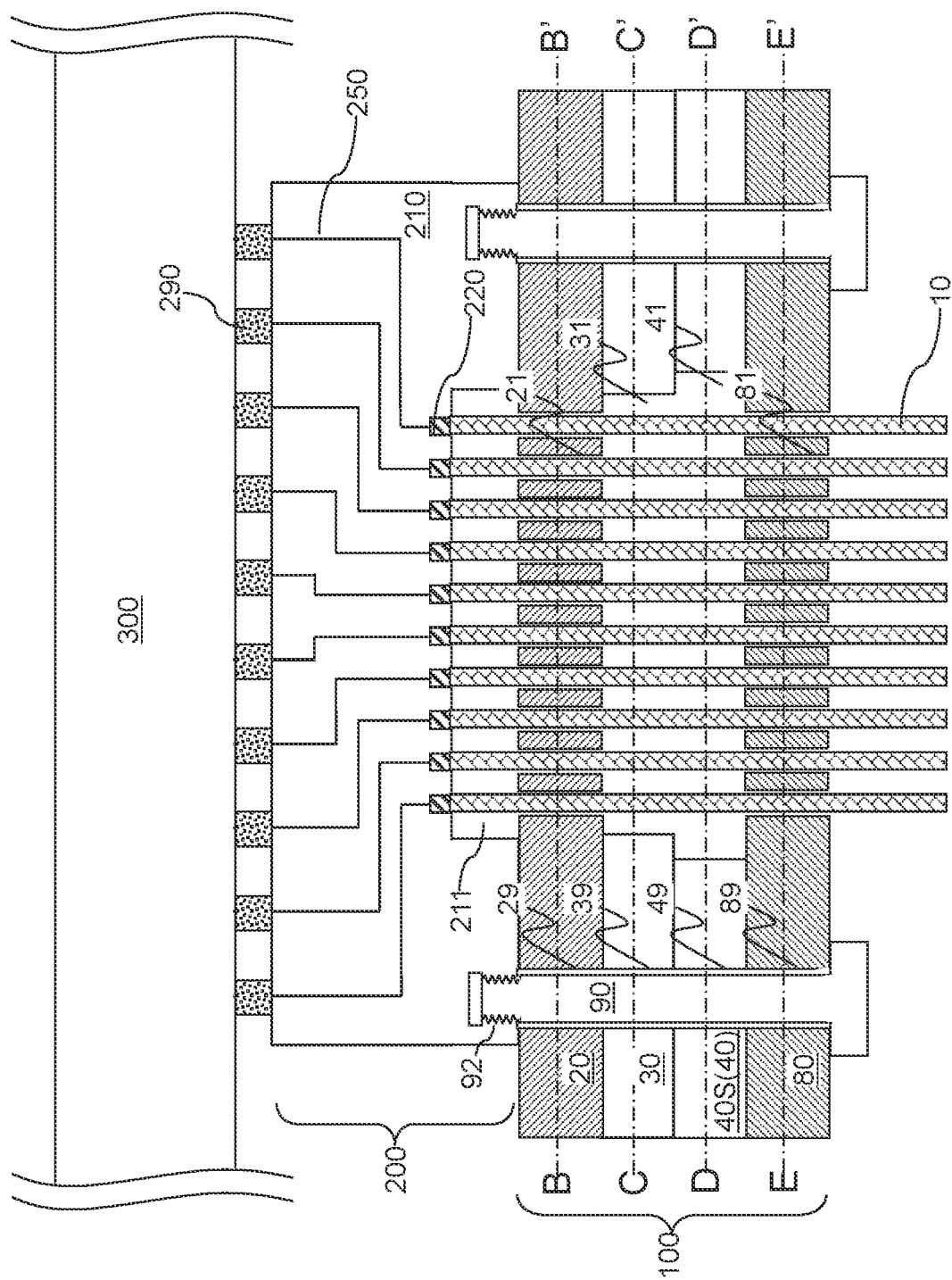
FIG. 2A is a vertical cross-sectional view of a first exemplary probe assembly along the vertical cut plane A-A' shown in FIGS. 2B, 2C, 2D, and 2E according to a first embodiment of the present disclosure.
Figure 2C:
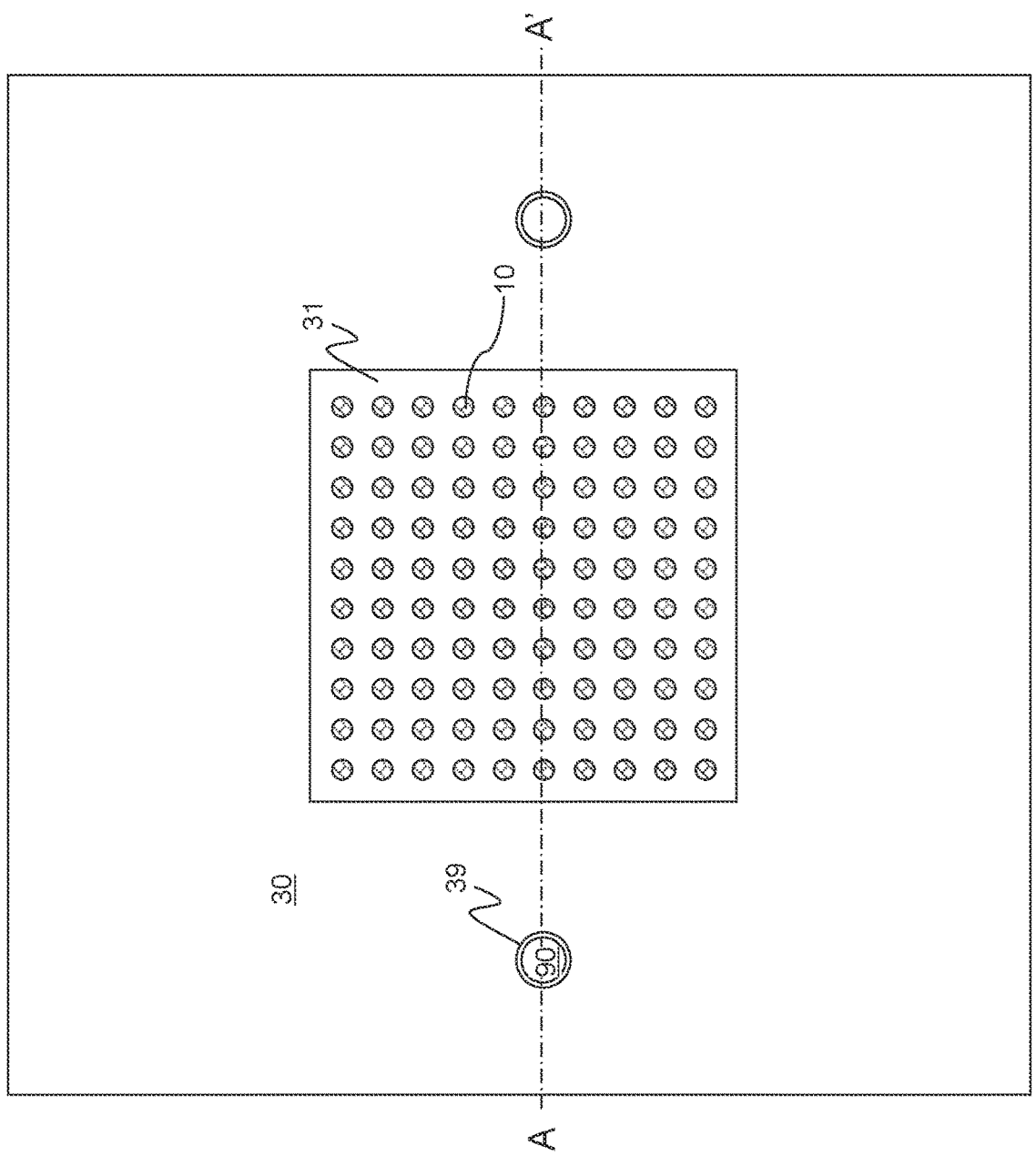
FIG. 2C is a horizontal cross-sectional view along the horizontal plane C-C' of the first exemplary probe assembly of FIG. 2A.
Figure 3A:
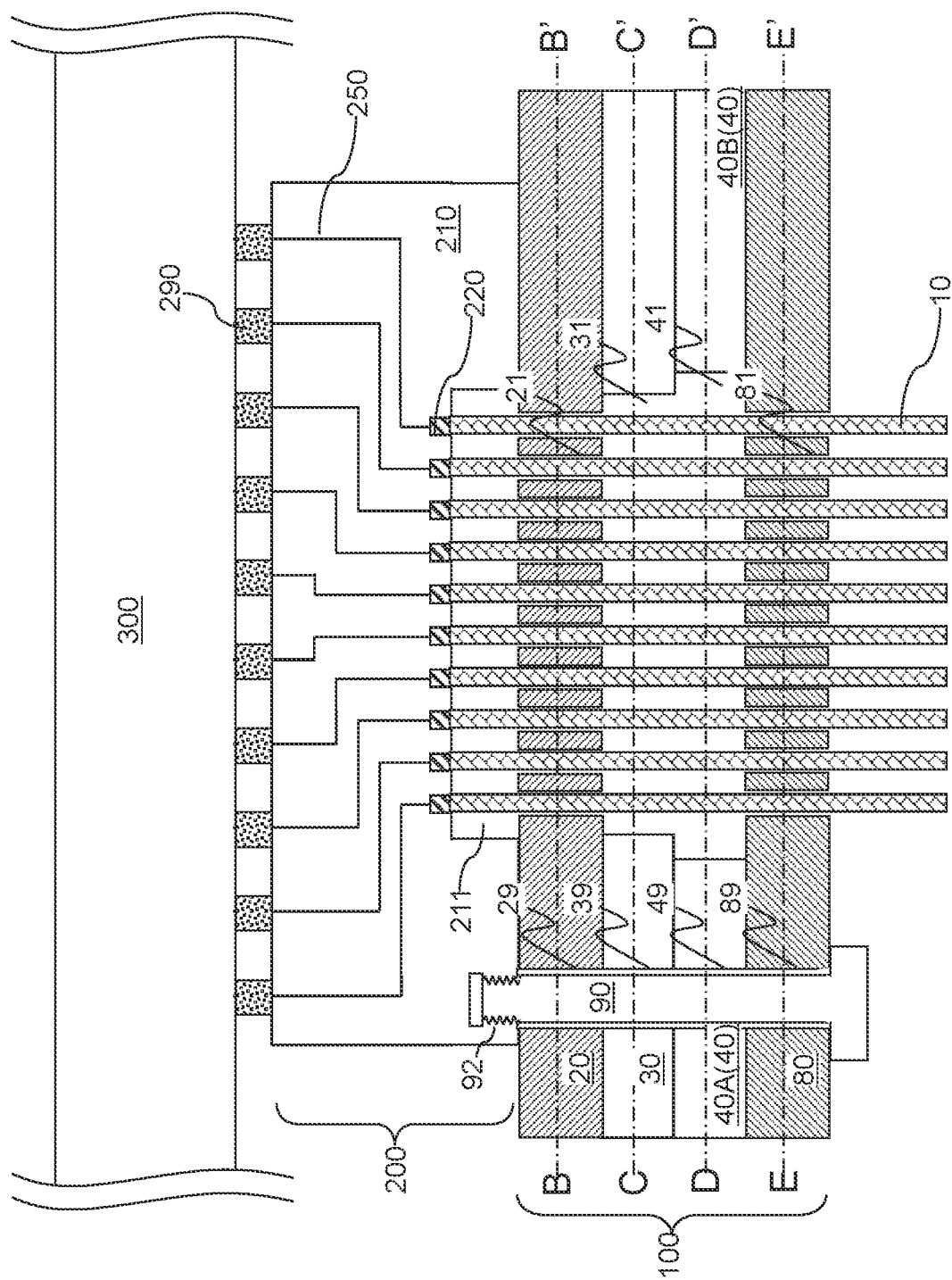
FIG. 3A is a vertical cross-sectional view of a second exemplary probe assembly along the vertical cut plane A-A' shown in FIGS. 3B, 3C, 3D, and 3E according to a second embodiment of the present disclosure.
Figure 4A:
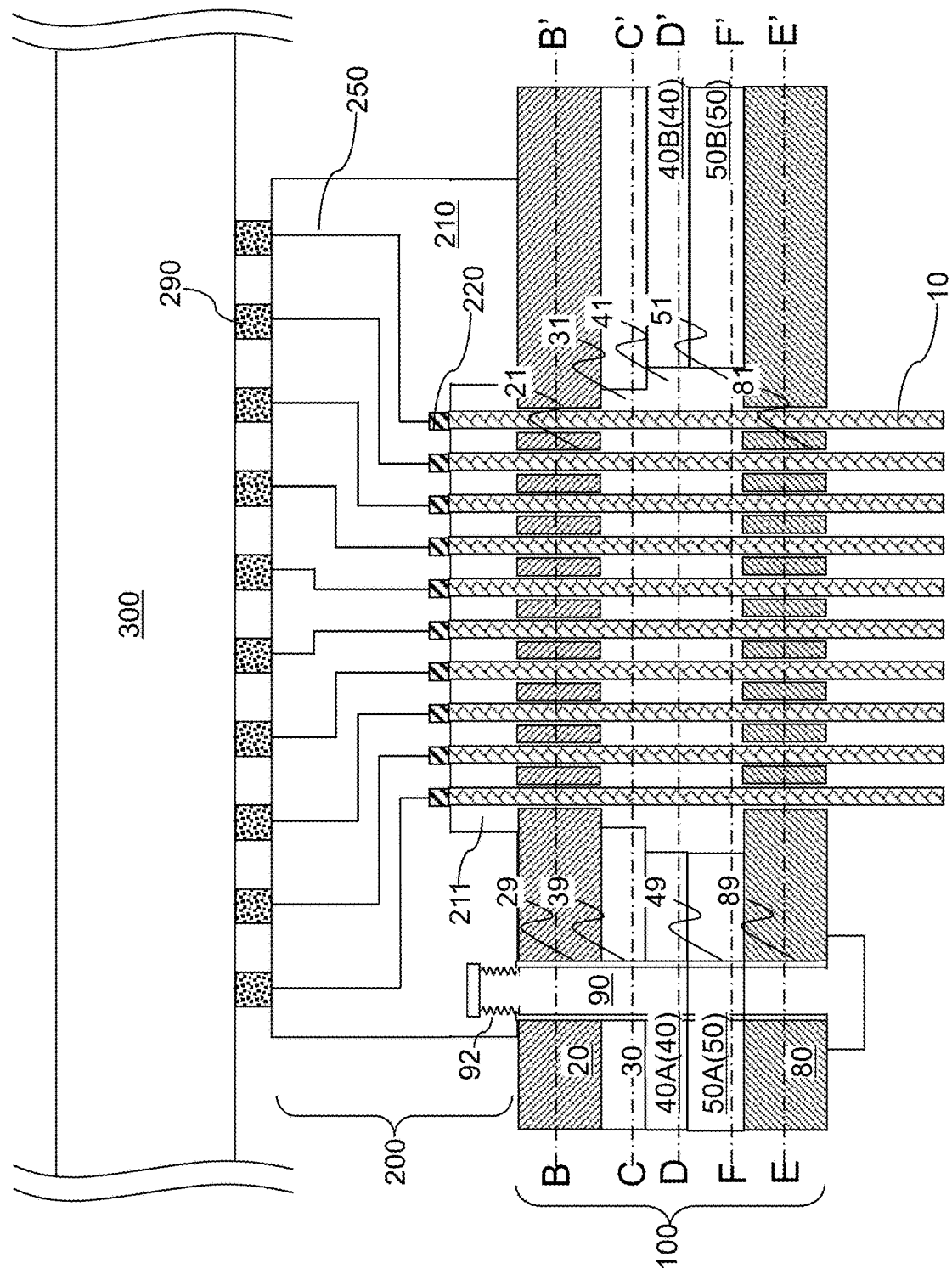
FIG. 4A is a vertical cross-sectional view of a third exemplary probe assembly along the vertical cut plane A-A' shown in FIGS. 4B, 4C, 4D, 4E, and 4F according to a third embodiment of the present disclosure.
Figure 4F:
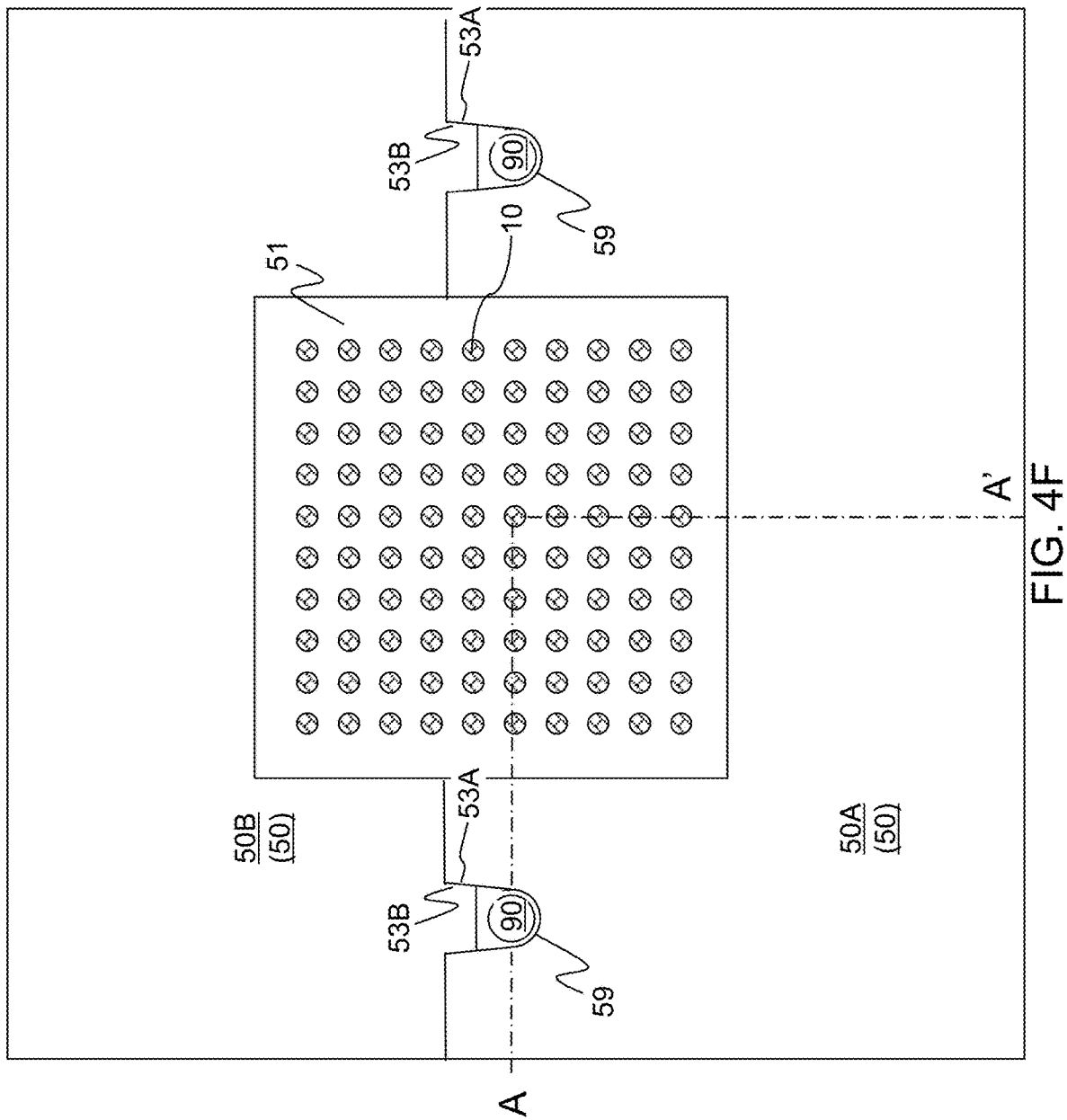
FIG. 4F is a horizontal cross-sectional view along the horizontal plane F-F' of the third exemplary probe assembly of FIG. 4A.

According to an aspect of the present disclosure, a dielectric spacer plate selected from the plurality of dielectric spacer plates (30, 40) may be configured to lateral insertion, i.e., may be configured for lateral insertion from the side of an assembly of remaining components of the illustrated structure of FIG. 2A. Such a dielectric spacer plate is herein referred to as a sliding dielectric spacer plate 40S. In this embodiment, the sliding dielectric spacer plate 40S may be inserted into an assembly including the multilayer structure 200, the array of probes 10 attached to the multilayer structure 200, an upper guide plate 20, the lower guide plate 80, and at least two guide posts 90 vertically passing through the guide openings (29, 89) after the automated probe insertion process.

In embodiments in which the plurality of dielectric spacer plates (30, 40) includes a unitary dielectric spacer plate 30 that includes at least to guide openings 39 through which the array of probes 10 may be inserted during the automated probe insertion process, the embodiments may further include a sliding dielectric spacer plate 40 that slide into a gap between the unitary dielectric spacer plate 30 and one of the upper guide plate 20 and the lower guide plate 80 after the automated probe insertion process.

In an illustrative example, a stack of the upper guide plate 20, the unitary dielectric spacer plate 30, and the lower guide plate 80 may be aligned with one another so that the array of upper holes 21 is vertically coincident with the array of lower holes 81, and is located entirely within the area of an opening 31 in the unitary dielectric spacer plate 30. The stack of the upper guide plate 20, the unitary dielectric spacer plate 30, and the lower guide plate 80 may be aligned to the array of probes 10. The probes 10 may be inserted through the upper holes 21 of the upper guide plate 20, the opening 31 in the unitary dielectric spacer plate 30, and the lower holes 81 of the lower guide plate 80 by performing the automated probe insertion process. In one embodiment, the probes 10 may be inserted through the stack of the upper guide plate 20, the unitary dielectric spacer plate 30, and the lower guide plate 80 one by one. In another embodiment, a set of multiple probes 10 may be inserted at each insertion operation through the stack of the upper guide plate 20, the unitary dielectric spacer plate 30, and the lower guide plate 80. After insertion through the stack of the upper guide plate 20, the unitary dielectric spacer plate 30, and the lower guide plate 80, each of the probes 10 may be attached to a respective one of the probe contact pads 220.

The thickness of the unitary dielectric spacer plate 30 is less than the sum of the thickness of the unitary dielectric spacer plate 30 and the sliding dielectric spacer plate 40S, which is the final target for the vertical spacing between the upper guide plate 20 and the lower guide plate 80 in a completed probe assembly (10, 100, 200). Thus, the automated probe insertion process as performed on the stack of the upper guide plate 20, the unitary dielectric spacer plate 30, and the lower guide plate 80 (i.e., without the sliding dielectric spacer plate 40S) takes a lesser time than an automated probe insertion process would take in instances in which a dielectric spacer plate having a same thickness as the final target spacing between the upper guide plate 20 and the lower guide plate 80 were to be used.

Subsequently, the at least two guide posts 90 may be inserted through the at least two lower guide openings 89, the at least two guide openings 39 through the unitary dielectric spacer plate 30, and the at least two upper guide openings 29. The at least to guide posts 90 may be affixed to the multilayer structure 200 through the fixture elements 92 and the mating fixture elements located within the multilayer structure 200. The at least two guide posts 90 are not tightened to a degree that prevents movement of the stack of the upper guide plate 20, the unitary dielectric spacer plate 30, and the lower guide plate 80, but are loosened sufficiently so that a gap between the unitary dielectric spacer plate 30 and one of the upper guide plate 20 and the lower guide plate 80 may be wider than the thickness of the sliding dielectric spacer plate 40S. The sliding dielectric spacer plate 40S may be oriented and positioned to avoid collision with the array of probes 10 or with the guide posts 90, and may be laterally slid into a final position, which is the position of the sliding dielectric spacer plate 40S as illustrated in FIG. 2A. The guide posts 90 may be placed firmly into a fixation position by tightening the guide posts 90. In embodiments in which the guide posts 90 include threaded bolts or threaded screws, the guide posts 90 may be turned until the plate assembly 100 is firmly and immovably attached to the multilayer structure 200.

According to an aspect of the present disclosure, the plate assembly 100 may include a plurality of dielectric spacer plates (30, 40). The plurality of dielectric spacer plates (30, 40) may include a unitary dielectric spacer plate 30 that functions as a base dielectric spacer that is used during an automatic probe insertion process. The automatic probe insertion process may be expedited due to the reduced thickness of the base dielectric spacer. In an illustrative example, a 4 mm thick dielectric spacer may be used in conjunction with a typical automatic probe insertion process. In such an example, about 2,500 probe insertion operations may be performed per day. In contrast, in embodiments in which a unitary dielectric spacer plate 30 having a thickness of about 2.5 mm is used in conjunction with a typical automatic probe insertion process, about 4,500 probe insertion operations may be performed per day. The plurality of dielectric spacer plates (30, 40) may include a sliding dielectric spacer plate 40S that may be slid into position after the automatic probe insertion process without requiring a significant amount of time for the sliding operation. In one embodiment, the sliding dielectric spacer plate 40S may include a pair of laterally-extending openings configurated to fit around a pair of guide posts 90, and the opening 41 in the sliding dielectric spacer plate 40S may be open toward one side to enable lateral sliding of the sliding dielectric spacer plate 40S without hitting the array of probes 10.

Referring to FIGS. 3A-3E, a second exemplary probe assembly according to a second embodiment of the present disclosure is illustrated. The second exemplary probe assembly may be derived from the first exemplary probe assembly illustrated in FIGS. 2A-2E by using a multi-segment dielectric spacer plate (40A, 40B) including a pair of a primary dielectric spacer plate segment 40A and a complementary dielectric spacer plate segment 40B disposed on a side of the primary dielectric spacer plate segment 40A as a dielectric spacer plate 40.

Referring to FIGS. 4A-4F, a third exemplary probe assembly according to a third embodiment of the present disclosure is illustrated. The third exemplary probe assembly may be derived from the first exemplary probe assembly illustrated in FIGS. 2A-2E by using two or more multi-segment dielectric spacer plates {(40A, 40B), (50A, 50B)} including a respective pair of a primary dielectric spacer plate segment (40A or 50A) and a complementary dielectric spacer plate segment (40B or 50B) located on a side of the primary dielectric spacer plate (40A or 50A) as dielectric spacer plates (40 or 50).

Generally, the second and third exemplary probe assemblies may be derived from the first exemplary probe assembly illustrated in FIGS. 2A-2E by using at least one multi-segment dielectric spacer plate {(40A, 40B), (50A, 50B)} including a respective pair of a primary dielectric spacer plate segment (40A or 50A) and a complementary dielectric spacer plate segment (40B or 50B) located on a side of the primary dielectric spacer plate (40A or 50A) as a respective dielectric spacer plate (40 or 50).

A multi-segment dielectric spacer plate (40 or 50) refers to a dielectric spacer plate that may include multiple discrete segments, i.e., as multiple discrete structures that are not structurally interconnected. Each segment of the multi-segment dielectric spacer plate (40 or 50) is herein referred to as a dielectric spacer plate segment. The segments of a multi-segment dielectric spacer plate 40 are distinct pieces that may be positioned independently. The segments of a multi-segment dielectric spacer plate (40 or 50) may be placed adjacent to each other, or may be placed on each other, to function as a dielectric spacer plate in embodiments of the present disclosure.

Referring collectively to FIGS. 3A-3E and 4A-4F, each dielectric spacer plate (30, 40, 50) selected from the plurality of dielectric spacer plates (30, 40, 50) comprises at least two guide openings (39, 49, 59) therethrough, and the probe assembly 100 may include at least two guide posts 90 vertically extending through a respective guide opening (39, 49, 59) within each dielectric spacer plate (30, 40, 50) selected from the plurality of dielectric spacer plates (30, 40, 50). In one embodiment, each primary dielectric spacer plate segment (40A or 50A) within the at least one multi-segment dielectric spacer plate {(40A, 40B), (50A, 50B)} may include a respective set of two or more guide openings 49 therethrough, and each complementary dielectric spacer plate segment (40B or 50B) within the at least one multi-segment dielectric spacer plate {(40A, 40B), (50A, 50B)} is free of any guide opening therethrough.

In one embodiment, each primary dielectric spacer plate segment (40A or 50A) within the at least one multi-segment dielectric spacer plate {(40A, 40B), (50A, 50B)} may include a respective first lateral alignment assist feature (43A, 53A), and each complementary dielectric spacer plate segment (40B or 50B) within the at least one multi-segment dielectric spacer plate {(40A, 40B), (50A, 50B)} which may include a respective second lateral alignment assist feature (43B, 53B) configured to mate with the respective first lateral alignment assist feature (43A, 53A), and to secure a relative position between the complementary dielectric spacer plate segment (40B or 50B) and the primary dielectric spacer plate segment 40A.

In one embodiment, one of the respective first lateral alignment assist feature (43A, 53A) and the respective second lateral alignment assist feature (43B, 53B) for each of the at least one multi-segment dielectric spacer plate {(40A, 40B), (50A, 50B)} may include a lateral protrusion feature (such as a lateral protrusion from a sidewall of the complementary dielectric spacer plate segment 40B), and another of the respective first lateral alignment assist feature (43A, 53A) and the respective second lateral alignment assist feature (43B, 53B) for each of the at least one multi-segment dielectric spacer plate {(40A, 40B), (50A, 50B)} may include a lateral recess cavity (such as a lateral recess cavity from a sidewall of the primary dielectric spacer plate segment 40A) having a same size as the lateral protrusion feature. In one embodiment, the lateral recess cavities may be connected to a respective one of the guide openings 49 in the multi-segment dielectric spacer plate {(40A, 40B), (50A, 50B)}.

In one embodiment, the upper guide plate 20 may include at least two upper guide openings 29 therethrough, the lower guide plate 80 may include at least two lower guide openings 89 therethrough, and each of the at least two guide posts 90 vertically extends through a respective one of the upper guide openings 29 and through a respective one of the lower guide openings 89.

In one embodiment, the primary dielectric spacer plate segment (40A or 50A) and the complementary dielectric spacer plate segment (40B or 50B) within each of the at least one multi-segment dielectric spacer plate {(40A, 40B), (50A, 50B)} may have a same thickness throughout and comprise a same dielectric material. In one embodiment, the complementary dielectric spacer plate segment (40B, 50B) may have a lesser area than the primary dielectric spacer plate segment (40A, 50A) within each of the at least one multi-segment dielectric spacer plate {(40A, 40B), (50A, 50B)}. In one embodiment, the ratio of the area of the complementary dielectric spacer plate segment (40B or 50B) to an area of the primary dielectric spacer plate segment (40A or 50A) within each of the at least one multi-segment dielectric spacer plate {(40A, 40B), (50A, 50B)} may be in a range from 0.25 to 0.49. The areas of the complementary dielectric spacer plate segment (40B or 50B) and the primary dielectric spacer plate segment (40A or 50A) may be measured in a plan view, i.e., in a view along a direction that is perpendicular to the interface between the plate assembly 100 and the multilayer structure 200.

In one embodiment, the plurality of dielectric spacer plates (30, 40, 50) may include at least one unitary dielectric spacer plate 30 that may include an outer periphery and an inner periphery that is laterally surrounded by, and is spaced from, the outer periphery, and laterally surrounding each probe 10 selected from the array of probes 10.

Referring collectively to FIGS. 1-4F, a tester apparatus is provided according to embodiments of the present disclosure. The test apparatus may include a wafer chuck 960 and a stage drive unit configured to drive the wafer chuck 960; a tester head assembly that may include a tester head 920, a probe card 300 attached to the tester head 920, and a probe assembly (10, 100, 200) attached to the probe card 300, wherein the probe assembly (10, 100, 200) may include: a multilayer structure 200 comprising probe contact pads 220; an upper guide plate 20 located on the multilayer structure 200; a lower guide plate 80 underlying the upper guide plate 20; a vertical stack of a plurality of dielectric spacer plates (30, 40, 50) located between the upper guide plate 20 and the lower guide plate 80 and may include a respective opening (31, 41, 51) therethrough, wherein the plurality of dielectric spacer plates (30, 40, 50) include at least one multi-segment dielectric spacer plate {(40A, 40B), (50A, 50B)} including a respective pair of a primary dielectric spacer plate segment (40A or 50A) and a complementary dielectric spacer plate segment (40B or 50B) in contact with sidewalls of the primary dielectric spacer plate segment (40A or 50A); and an array of probes 10 attached to the probe contact pads 220, and vertically extending through the upper guide plate 20, the lower guide plate 80, and the vertical stack of the plurality of dielectric spacer plates (30, 40, 50).

In one embodiment, the upper guide plate 20 may include an array of upper holes 21 therethrough; the lower guide plate 80 may include an array of lower holes 81 therethrough; and the array of probes 10 passes through the array of upper holes 21 and the array of lower holes 81.

In one embodiment, each primary dielectric spacer plate segment (40A or 50A) within the at least one multi-segment dielectric spacer plate {(40A, 40B), {150A, 50B)} may include a respective set of two or more guide openings (49, 59) therethrough; and each complementary dielectric spacer plate segment (40B, 50B) within the at least one multi-segment dielectric spacer plate {(40A, 40B), {50A, 50B)} is free of any guide opening therethrough. In other words, guide posts 90 do not vertically extend through any complementary dielectric spacer plate segment (40B, 50B).

In one embodiment, each primary dielectric spacer plate segment (40A, 50A) within the at least one multi-segment dielectric spacer plate {(40A, 40B), {50A, 50B)} may include a respective first lateral alignment assist feature (43A or 53A); and each complementary dielectric spacer plate segment (40B, 50B) within the at least one multi-segment dielectric spacer plate {(40A, 40B), {50A, 50B)} may include a respective second lateral alignment assist feature (43B or 53B) configured to mate with the respective first lateral alignment assist feature (43A or 53A).

Figure 5:
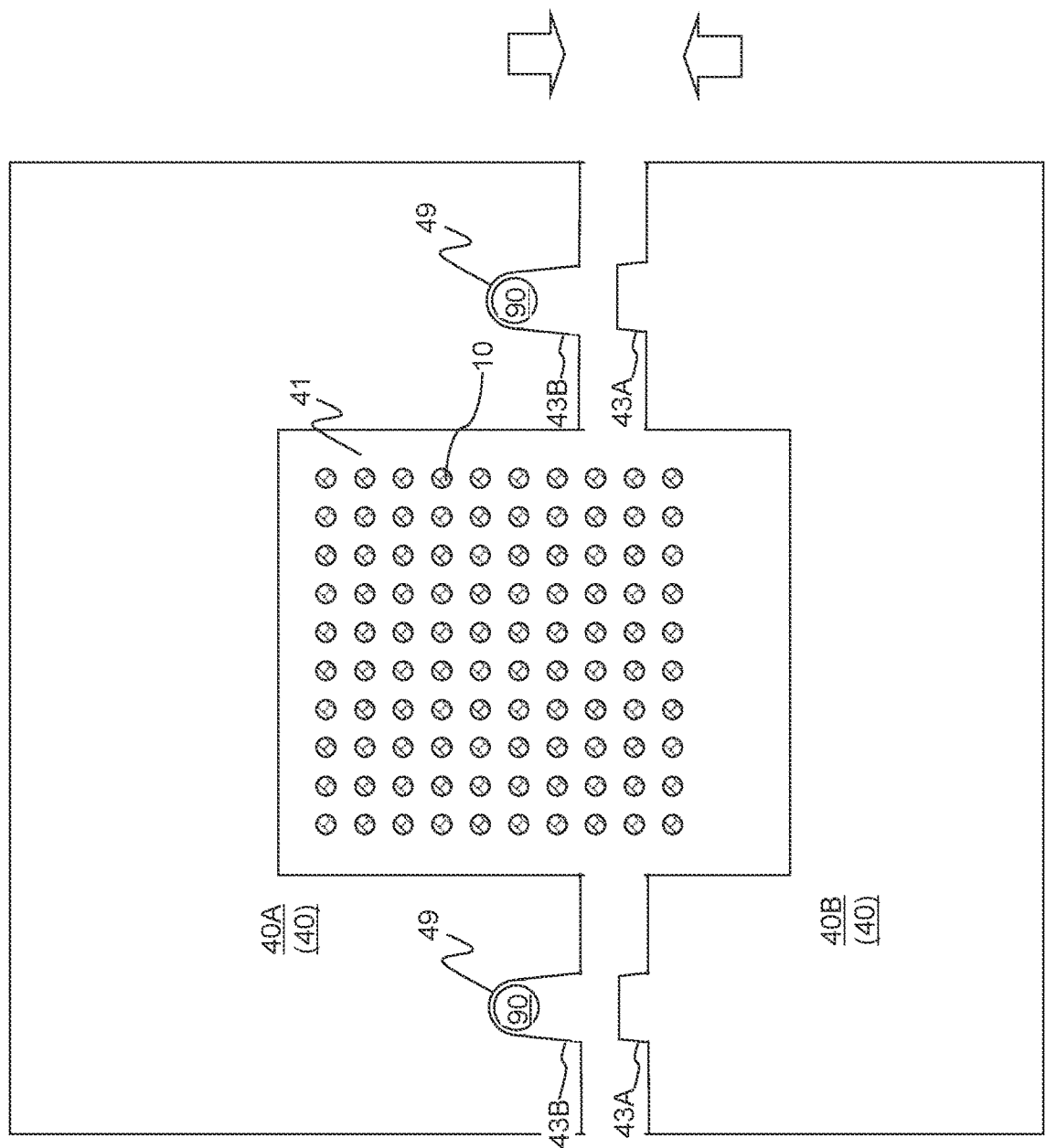
FIG. 5 is a horizontal cross-sectional view of a multi-segment dielectric spacer plate during lateral insertion of a complementary dielectric spacer plate segment according to an embodiment of the present disclosure.

Referring to FIG. 5, a process of laterally inserting a primary dielectric spacer plate segment 40A and a complementary dielectric spacer plate segment 40B within a multi-segment dielectric spacer plate (40A, 40B) is schematically illustrated. The lateral insertion of the primary dielectric spacer plate segment 40A and the complementary dielectric spacer plate segment 40B may be performed after the automated probe insertion process is complete and after the entire array of probes 10 is attached to the probe contact pads 220. Each of the primary dielectric spacer plate segment 40A and the complementary dielectric spacer plate segment 40B may be moved into the respective target location (i.e., the final location) by forming a gap for accommodating the multi-segment dielectric spacer plate (40A, 40B) between a unitary dielectric spacer plate 30 and one of the upper guide plate 20 and the lower guide plate 80, and by laterally sliding the primary dielectric spacer plate segment 40A and the complementary dielectric spacer plate segment 40B into the gap to a respective final target position while avoiding collision with the array of probes 10 or with the guide posts 90, for example, one by one.

Generally, the primary dielectric spacer plate segment (40A, 50A) and the complementary dielectric spacer plate segment (40B, 50B) within each multi-segment dielectric spacer plate (40, 50) may be disposed on a respective sidewall of each other. Each mating pair of a first lateral alignment assist feature (43A, 53A) and a complementary dielectric spacer plate segment (40B or 50B) may be configured to fit each other.

Figure 6:
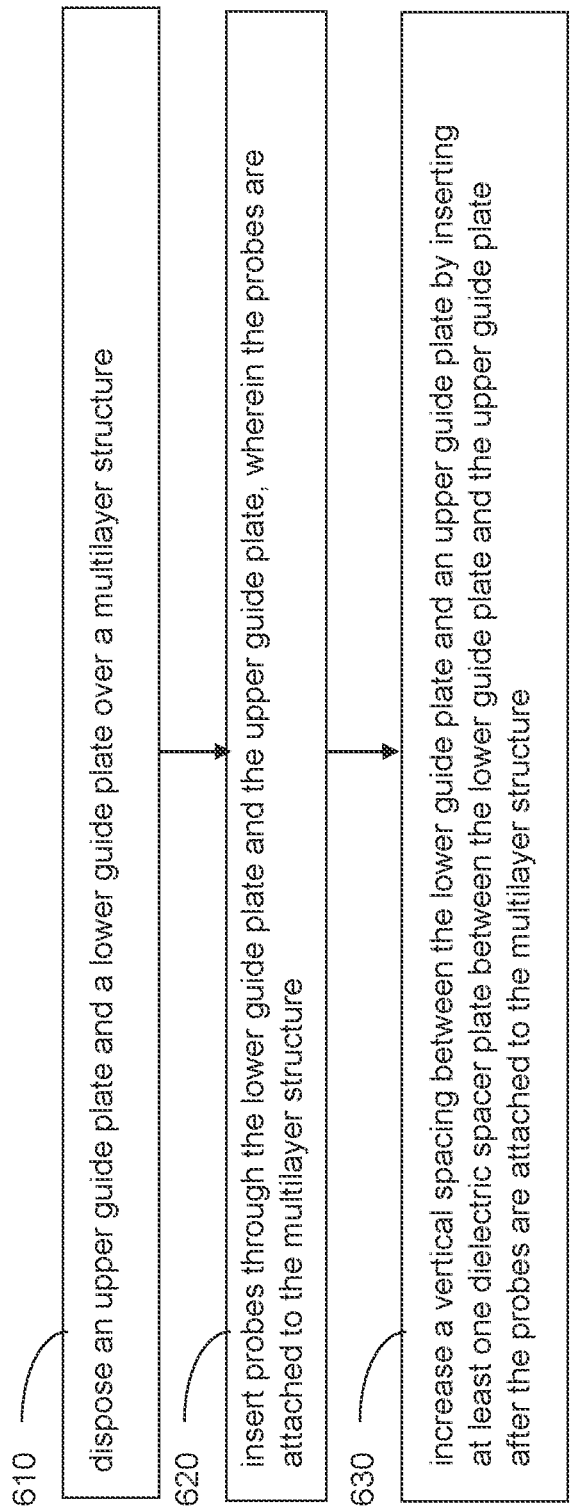
FIG. 6 is a flowchart that illustrates the general processing steps for assembling a probe assembly according to an aspect of the present disclosure.

Referring to FIG. 6, a flowchart illustrates the general processing steps for assembling a probe assembly (10, 100, 200) according to an aspect of the present disclosure.

Referring to step 610, an upper guide plate 20 and a lower guide plate 80 may be disposed over a multilayer structure 200.

Referring to step 620, probes 10 may be inserted through the lower guide plate 80 and the upper guide plate 20. The probes 10 may be attached to the multilayer structure 200 sequentially in the order of the insertion, or simultaneously after all of the probes 10 are inserted.

Referring to step 630, a vertical spacing between the lower guide plate 80 and the upper guide plate 20 may be increased by inserting at least one dielectric spacer plate (40, 50) between the lower guide plate 80 and the upper guide plate 20 after the probes 10 are attached to the multilayer structure 200.

In one embodiment, a unitary dielectric spacer plate 30 may be disposed over the upper guide plate 20 prior to an automated probe insertion process. The lower guide plate 80 may be disposed over the unitary dielectric spacer plate 30 prior to the automated pin insertion process. Thus, the probes 10 are inserted through the unitary dielectric spacer plate 30.

In one embodiment, each of the at least one dielectric spacer plate (40, 50) may be inserted between the unitary dielectric spacer plate 30 and a respective one of the upper guide plate 20 and the lower guide plate 80.

In one embodiment, the at least one dielectric spacer plate (40, 50) comprises a multi-segment dielectric spacer plate {(40A, 40B), (50A, 50B)} including a primary dielectric spacer plate segment (40A, 50A) and a complementary dielectric spacer segment (40B, 50B). The primary dielectric spacer plate segment (40A, 50A) and the complementary dielectric spacer segment (40B, 50B) may be sequentially inserted, in forward order or in reverse order, between the upper guide plate 20 and the lower guide plate 80.

In one embodiment, the complementary dielectric spacer plate segment (40B, 50B) may be disposed on the sidewalls of the primary dielectric plate segment (40A, 50A) if the complementary dielectric spacer plate segment (40B, 50B) is inserted after insertion of the primary dielectric plate segment (40A, 50A). Alternatively, the primary dielectric plate segment (40A, 50A) may be disposed on the sidewalls of the complementary dielectric spacer plate segment (40B, 50B) if the primary dielectric plate segment (40A, 50A) is inserted after insertion of the complementary dielectric spacer plate segment (40B, 50B).

The various embodiments of the present disclosure may accelerate a probe assembly manufacture process that forms a probe assembly (10, 100, 200) including a multilayer structure 200, a plate assembly 100, and an array of probes 10 attached to the multilayer structure 200 by reducing the thickness of a material layer stack used at the time of the automated probe insertion process, and may increase the throughput of the probe assembly manufacture process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe assembly comprising:
a multilayer structure comprising probe contact pads, redistribution structures, and a multilayer dielectric matrix surrounding the redistribution structures, wherein the probe contact pads are connected to a respective one of the redistribution structures;
an upper guide plate comprising an array of upper holes therethrough;
a lower guide plate comprising an array of lower holes therethrough;
a vertical stack of a plurality of dielectric spacer plates located between the upper guide plate and the lower guide plate and comprising openings corresponding to the upper holes and the lower holes therethrough; and
an array of probes attached to the probe contact pads, vertically extending through the array of upper holes and the array of lower holes, and vertically extending through the openings through the vertical stack of the plurality of dielectric spacer plates.

2. The probe assembly of claim 1, wherein the plurality of dielectric spacer plates comprises at least one multi-segment dielectric spacer plate including a respective pair of a primary dielectric spacer plate segment and a complementary dielectric spacer plate segment located on a side of the primary dielectric spacer plate.

3. The probe assembly of claim 2, wherein:
each dielectric spacer plate selected from the plurality of dielectric spacer plates comprises at least two guide openings therethrough; and
the probe assembly comprises at least two guide posts vertically extending through a respective guide opening within each dielectric spacer plate selected from the plurality of dielectric spacer plates.

4. The probe assembly of claim 3, wherein:
each primary dielectric spacer plate segment within the at least one multi-segment dielectric spacer plate comprises a respective set of two or more guide openings therethrough; and
each complementary dielectric spacer plate segment within the at least one multi-segment dielectric spacer plate is free of any guide opening therethrough.

5. The probe assembly of claim 3, wherein:
each primary dielectric spacer plate segment within the at least one multi-segment dielectric spacer plate comprises a respective first lateral alignment assist feature; and
each complementary dielectric spacer plate segment within the at least one multi-segment dielectric spacer plate comprises a respective second lateral alignment assist feature configured to mate with the respective first lateral alignment assist feature.

6. The probe assembly of claim 5, wherein:
one of the respective first lateral alignment assist feature and the respective second lateral alignment assist feature for each of the at least one multi-segment dielectric spacer plate comprises a lateral protrusion feature; and
another of the respective first lateral alignment assist feature and the respective second lateral alignment assist feature for each of the at least one multi-segment dielectric spacer plate comprises a lateral recess cavity having a same size as the lateral protrusion feature.

7. The probe assembly of claim 3, wherein:
the upper guide plate comprises at least two upper guide openings therethrough;
the lower guide plate comprises at least two lower guide openings therethrough; and
each of the at least two guide posts vertically extends through a respective one of the upper guide openings and through a respective one of the lower guide openings.

8. The probe assembly of claim 2, wherein the primary dielectric spacer plate segment and the complementary dielectric spacer plate segment within each of the at least one multi-segment dielectric spacer plate have a same thickness throughout and comprise a same dielectric material.

9. The probe assembly of claim 2, wherein a ratio of an area of the complementary dielectric spacer plate segment to an area of the primary dielectric spacer plate segment within each of the at least one multi-segment dielectric spacer plate is in a range from 0.25 to 0.49.

10. The probe assembly of claim 2, wherein the plurality of dielectric spacer plates comprises a plurality of multi-segment dielectric spacer plates including a pair of a respective primary dielectric spacer plate segment and a respective complementary dielectric spacer plate segment.

11. The probe assembly of claim 2, wherein the plurality of dielectric spacer plates comprises at least one unitary dielectric spacer plate comprising an outer periphery and an inner periphery that is laterally surrounded by, and is spaced from, the outer periphery, and laterally surrounding each probe selected from the array of probes.

12. A test apparatus comprising:
a wafer chuck and a stage drive unit configured to drive the wafer chuck;
a tester head assembly comprising a tester head, a probe card attached to the tester head, and a probe assembly attached to the probe card, wherein the probe assembly comprises:
a multilayer structure comprising probe contact pads;
an upper guide plate located on the multilayer structure;
a lower guide plate underlying the upper guide plate;
a vertical stack of a plurality of dielectric spacer plates located between the upper guide plate and the lower guide plate and comprising an opening therethrough, wherein the plurality of dielectric spacer plates comprises at least one multi-segment dielectric spacer plate including a respective pair of a primary dielectric spacer plate segment and a complementary dielectric spacer plate segment in contact with sidewalls of the primary dielectric spacer plate segment, wherein:
each primary dielectric spacer plate segment within the at least one multi-segment dielectric spacer plate comprises a respective set of two or more guide openings therethrough; and
each complementary dielectric spacer plate segment within the at least one multi-segment dielectric spacer plate is free of any guide opening therethrough; and
an array of probes attached to the probe contact pads, and vertically extending through the upper guide plate, the lower guide plate, and the vertical stack of the plurality of dielectric spacer plates.

13. The test apparatus of claim 12, wherein:
the upper guide plate comprises an array of upper holes therethrough;
the lower guide plate comprises an array of lower holes therethrough; and
the array of probes passes through the array of upper holes and the array of lower holes.

14. The test apparatus of claim 12, wherein:
each primary dielectric spacer plate segment within the at least one multi-segment dielectric spacer plate comprises a respective first lateral alignment assist feature; and
each complementary dielectric spacer plate segment within the at least one multi-segment dielectric spacer plate comprises a respective second lateral alignment assist feature configured to mate with the respective first lateral alignment assist feature.

15. The test apparatus of claim 12, wherein:
each primary dielectric spacer plate segment within the at least one multi-segment dielectric spacer plate comprises a respective first lateral alignment assist feature; and
each complementary dielectric spacer plate segment within the at least one multi-segment dielectric spacer plate comprises a respective second lateral alignment assist feature configured to mate with the respective first lateral alignment assist feature.

16. The test apparatus of claim 15, wherein:
one of the respective first lateral alignment assist feature and the respective second lateral alignment assist feature for each of the at least one multi-segment dielectric spacer plate comprises a lateral protrusion feature; and
another of the respective first lateral alignment assist feature and the respective second lateral alignment assist feature for each of the at least one multi-segment dielectric spacer plate comprises a lateral recess cavity having a same size as the lateral protrusion feature.

17. The test apparatus of claim 12, wherein:
the upper guide plate comprises at least two upper guide openings therethrough;
the lower guide plate comprises at least two lower guide openings therethrough; and
each of the at least two guide posts vertically extends through a respective one of the upper guide openings and through a respective one of the lower guide openings.

18. A method of assembling a probe assembly, comprising:
disposing an upper guide plate, a unitary dielectric spacer plate, and a lower guide plate over a multilayer structure, wherein the unitary dielectric spacer plate is disposed over the upper guide plate, wherein the lower guide plate is disposed over the unitary dielectric spacer plate,
inserting probes through the lower guide plate, the unitary dielectric spacer plate, and the upper guide plate, wherein the probes are attached to the multilayer structure; and increasing a vertical spacing between the lower guide plate and the upper guide plate by inserting at least one dielectric spacer plate between the lower guide plate and the upper guide plate after the probes are attached to the multilayer structure.

19. The method of claim 18, wherein each of the at least one dielectric spacer plate is inserted between the unitary dielectric spacer plate and a respective one of the upper guide plate and the lower guide plate.

20. The method of claim 19, wherein the at least one dielectric spacer plate comprises a multi-segment dielectric spacer plate including a primary dielectric spacer plate segment and a complementary dielectric spacer segment, and wherein the method comprises sequentially inserting, in forward order or in reverse order, the primary dielectric spacer plate segment and the complementary dielectric spacer segment.

\* \* \* \* \*